(12) United States Patent
Sambandamurthy et al.

(10) Patent No.: US 8,610,435 B2
(45) Date of Patent: Dec. 17, 2013

(54) FOCUS COIL ARRAY AND INTERFACE DEVICES THEREFOR

(75) Inventors: Sriram Sambandamurthy, Murrysville, PA (US); Robert J. McKenney, Indianola, PA (US)

(73) Assignee: MEDRAD, Inc., Indianola, PA (US)

( * ) Notice: Subject to any disclaimer, the term of this patent is extended or adjusted under 35 U.S.C. 154(b) by 436 days.

(21) Appl. No.: 12/952,988

(22) Filed: Nov. 23, 2010

(65) Prior Publication Data

US 2011/0121833 A1   May 26, 2011

Related U.S. Application Data

(60) Provisional application No. 61/263,887, filed on Nov. 24, 2009.

(51) Int. Cl.
*G01V 3/00* (2006.01)
*G01R 33/44* (2006.01)

(52) U.S. Cl.
USPC .......................... 324/318; 324/307; 324/322

(58) Field of Classification Search
USPC .......................... 324/300–322; 600/407–464
See application file for complete search history.

(56) References Cited

U.S. PATENT DOCUMENTS

| | | |
|---|---|---|
| 4,739,271 A | 4/1988 | Hasse |
| 4,816,765 A | 3/1989 | Boskamp |
| 4,928,064 A | 5/1990 | Keren |
| 4,947,121 A | 8/1990 | Hayes |
| 5,050,607 A | 9/1991 | Bradley et al. |
| 5,198,768 A | 3/1993 | Keren |
| 5,307,814 A | 5/1994 | Kressel et al. |
| 5,348,010 A | 9/1994 | Schnall et al. |
| 5,355,087 A | 10/1994 | Claiborne et al. |

(Continued)

FOREIGN PATENT DOCUMENTS

| | | |
|---|---|---|
| JP | 02200244 | 1/1989 |
| JP | 200170278 | 3/2001 |

(Continued)

OTHER PUBLICATIONS

Misic, G.J. et al., "Endorectal Coils and Interface for 3.0 Tesla Imaging and Spectroscopy", Proc. Intl. Soc. Mag. Reson Med. 11 (2003), p. 2399.

(Continued)

*Primary Examiner* — Melissa Koval
*Assistant Examiner* — Emily Chan
(74) *Attorney, Agent, or Firm* — James Stevenson; Ryan Miller

(57) ABSTRACT

A coil for use with a magnetic resonance (MR) system includes an outer loop having a first end and a second end formed from a conductive material for detecting MR signals oriented vertical to a plane of the coil. The outer loop has a plurality of capacitors therein including: (i) a first drive capacitor and a second drive capacitor of approximately equal value serially deployed within the outer loop at the first end of the outer loop with a junction node therebetween; and (ii) a third drive capacitor and a fourth drive capacitor serially deployed within the outer loop at the second end of the outer loop with a junction node therebetween. The coil also includes a first center conductor extending between and evenly bisecting the junction nodes of the outer loop and a second center conductor extending perpendicular to the first center conductor and evenly bisecting the outer loop.

18 Claims, 34 Drawing Sheets

(56) References Cited

U.S. PATENT DOCUMENTS

| | | | |
|---|---|---|---|
| 5,365,928 | A | 11/1994 | Rhinehart |
| 5,451,232 | A | 9/1995 | Rhinehart et al. |
| 5,476,095 | A | 12/1995 | Schnall et al. |
| 5,483,159 | A * | 1/1996 | Van Heelsbergen .......... 324/318 |
| 5,548,218 | A | 8/1996 | Lu |
| 5,583,438 | A | 12/1996 | Eydelman et al. |
| 5,757,189 | A * | 5/1998 | Molyneaux et al. .......... 324/318 |
| 7,714,581 | B2 * | 5/2010 | Erickson et al. .............. 324/322 |
| 7,747,310 | B2 | 6/2010 | Misic et al. |
| 7,885,704 | B2 | 2/2011 | Misic |
| 7,911,209 | B2 | 3/2011 | Alradady et al. |
| 2002/0040185 | A1 | 4/2002 | Atalar et al. |
| 2006/0158189 | A1* | 7/2006 | Saylor et al. ................... 324/318 |
| 2009/0076378 | A1 | 3/2009 | Misic |
| 2011/0215807 | A1* | 9/2011 | Misic et al. ................... 324/322 |

FOREIGN PATENT DOCUMENTS

| | | |
|---|---|---|
| WO | 8905115 | 6/1989 |
| WO | 03098236 | 11/2003 |
| WO | WO 03/098236 * | 11/2003 |
| WO | 2010056911 | 5/2010 |

OTHER PUBLICATIONS

Atalar, et al., "High Resolution Intravascular MRI and MRS by Using a Catheter Receiver Coil", MRM 36: 596-605, (1996), Johns Hopkins University School of Medicine, Department of Radiology and Division of Cardiology.

Supplemental European Patent Search report, EP application No. EP 03 71 4134.

Kumar, Ananda et al., "Optimized Quadrature Surface Coil Designs", MAGMA, Mar. 2008; 21 (1-2).

* cited by examiner

BUTTERFLY COIL

HORIZONTAL FIELD

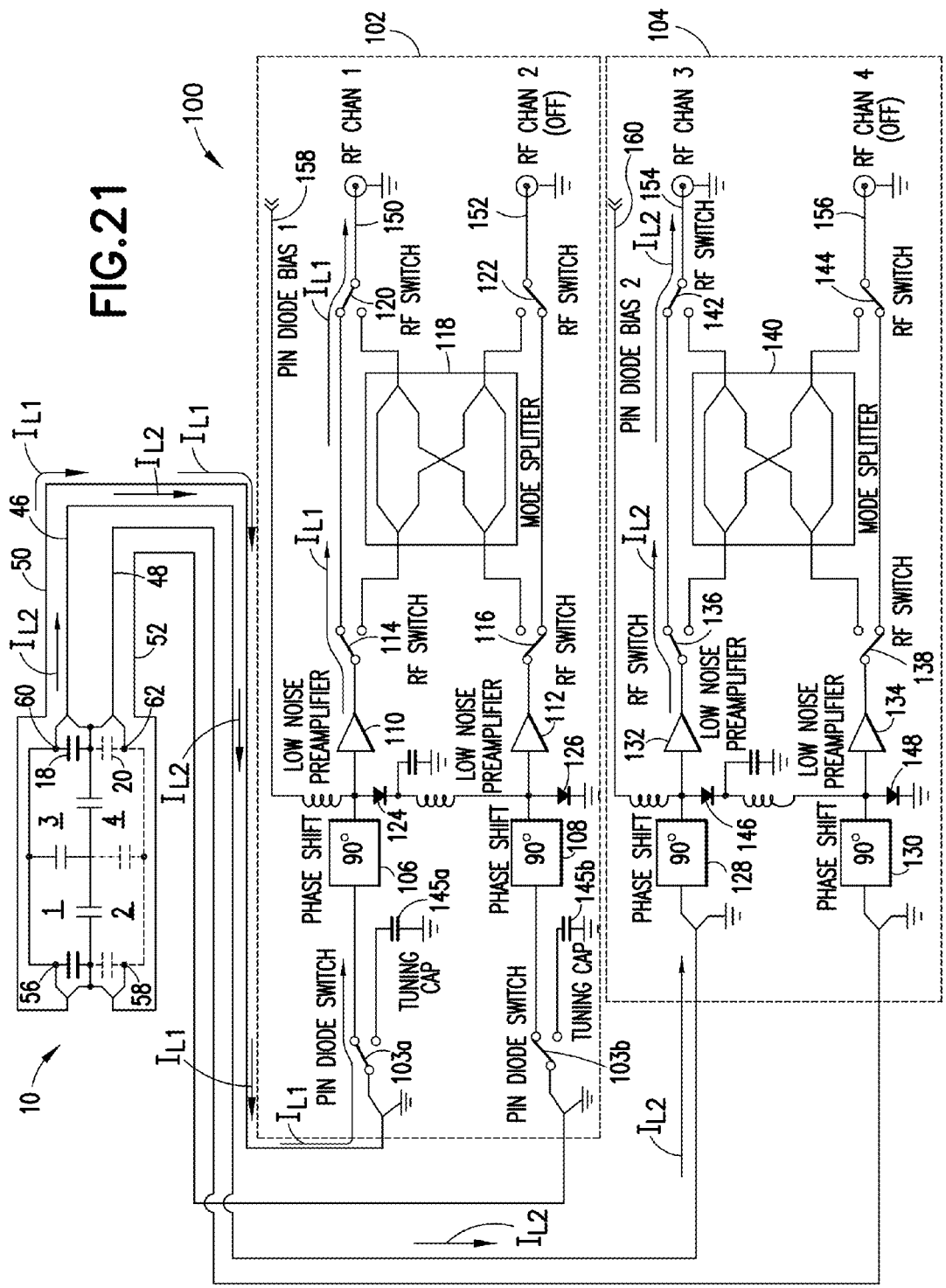

FOCUS COIL ARRAY AND INTERFACE DEVICES THEREFOR

CROSS REFERENCE TO RELATED APPLICATIONS

This application claims the benefit of U.S. Provisional Patent Application Ser. No. 61/263,887 entitled "Zoom Coil Array and Interface Devices Therefor" filed Nov. 24, 2009, the contents of which are incorporated herein by reference.

BACKGROUND OF THE INVENTION

1. Field of the Invention

The present invention generally relates to systems and methods of obtaining images and spectra of anatomical structures using magnetic resonance (MR) systems. More particularly, the present invention pertains to multiple embodiments of a multichannel surface coil array and associated interface devices capable of providing images and spectroscopic results from the MR signals obtained from the nuclei excited during MR procedures.

2. Description of Related Art

The following background information is provided to assist the reader to understand the invention disclosed below and the environment in which it will typically be used. The terms used herein are not intended to be limited to any particular narrow interpretation unless clearly stated otherwise, either expressly or impliedly, in this document.

Magnetic resonance imaging (MRI) is a noninvasive method of producing high quality images of the interior of the human body. It allows medical personnel to see inside the human body without surgery or the use of ionizing radiation such as X-rays. The images are of such high resolution that cancer and other forms of pathology can often be visually distinguished from healthy tissue. Magnetic resonance techniques and systems have also been developed for performing spectroscopic analyses by which the chemical content of body tissue or other material can be ascertained.

MRI uses a powerful magnet, radio waves and computer technology to create detailed images of the soft tissues, muscles, nerves and bones in the body. It does so by taking advantage of a basic property of the hydrogen atom, an atom found in abundance in all cells within living organisms. In the absence of a magnetic field, the nuclei of hydrogen atoms spin like a top, or precess, randomly in every direction. When subject to a strong magnetic field, however, the spin-axes of the hydrogen nuclei align themselves in the direction of the field. This is because the nucleus of the hydrogen atom has what is referred to as a large magnetic moment, a strong inherent tendency to line up with the direction of the field. Collectively, the hydrogen nuclei of the area to be imaged create an average vector of magnetization that points parallel to the magnetic field.

A typical MRI system, or scanner, includes a main magnet, three gradient coils, a radio frequency (RF) antenna (often referred to as the whole body coil), and a computer station from which an operator can control the system. The chief component of the MRI system, however, is the main magnet. It is typically superconducting in nature and cylindrical in shape. Within its bore (an opening into which patients are placed during an MRI procedure), the main magnet generates a strong magnetic field, often referred to as the B0 field, which is both uniform and static (non-varying). This B0 magnetic field is oriented along the longitudinal axis of the bore, referred to as the z direction, which compels the magnetization vectors of the hydrogen nuclei in the body to align themselves parallel to that axis. In this alignment, the nuclei are prepared to receive RF energy of the appropriate frequency from the whole body coil. This frequency is known as the Larmor frequency and is governed by the equation $\omega=\gamma B0$, where $\omega$ is the Larmor frequency (at which the hydrogen atoms precess), $\gamma$ is the gyromagnetic constant, and B0 is the strength of the static magnetic field.

The RF antenna, or whole body coil, is generally used both to transmit pulses of RF energy and to receive the resulting MR signals induced thereby in the hydrogen nuclei. Specifically, during its transmit cycle, the body coil broadcasts RF energy into the cylindrical bore. This RF energy creates a radio frequency magnetic field, also known as the RF B1 field, whose magnetic field lines are directed in a line perpendicular to the magnetization vector of the hydrogen nuclei. The RF pulse causes the spin-axes of the hydrogen nuclei to tilt with respect to the main (B0) magnetic field, thus causing the net magnetization vector to deviate from the z direction by a known angle. The RF pulse, however, will affect only those hydrogen nuclei that are precessing about their axes at the frequency of the RF pulse. In other words, only the nuclei that "resonate" at that frequency will be affected, and such resonance is achieved in conjunction with the operation of the three gradient coils.

The gradient coils are electromagnetic coils. Each gradient coil is used to generate a linearly varying yet static magnetic field along one of the three spatial directions (x,y,z) within the cylindrical bore known as the gradient B1 field. Positioned inside the main magnet, the gradient coils are able to alter the main magnetic field on a very local level when they are turned on and off very rapidly in a specific manner. Thus, in conjunction with the main magnet, the gradient coils can be operated according to various imaging techniques so that the hydrogen nuclei, at any given point or in any given strip, slice or unit of volume, will be able to achieve resonance when an RF pulse of the appropriate frequency is applied. In response to the RF pulse, the precessing hydrogen atoms in the selected region absorb the RF energy being transmitted from the body coil, thus forcing the magnetization vectors thereof to tilt away from the direction of the main (B0) magnetic field. When the body coil is turned off, the hydrogen nuclei begin to release the RF energy in the form of the MR signal, as explained further below.

One well known technique that can be used to obtain images is referred to as the spin echo imaging technique. Operating according to this technique, the MRI system first activates one gradient coil to set up a magnetic field gradient along the z-axis. This is called the "slice select gradient", and it is set up when the RF pulse is applied and it shuts off when the RF pulse is turned off. It allows resonance to occur only within those hydrogen nuclei located within a slice of the area being imaged. No resonance will occur in any tissue located on either side of the plane of interest. Immediately after the RF pulse ceases, all of the nuclei in the activated slice are "in phase", i.e., their magnetization vectors all point in the same direction. Left to their own devices, the net magnetization vectors of all the hydrogen nuclei in the slice would relax, thus realigning with the z direction. Instead, however, the second gradient coil is briefly activated to create a magnetic field gradient along the y-axis. This is called the "phase encoding gradient". It causes the magnetization vectors of the nuclei within the slice to point, as one moves between the weakest and strongest ends of the gradient, in increasingly different directions. Next, after the RF pulse, slice select gradient and phase encoding gradient have been turned off, the third gradient coil is briefly activated to create a gradient along the x-axis. This is called the "frequency encoding gradient" or "read out gradient", as it is only applied when the MR signal is ultimately measured. It causes the relaxing magnetization vectors to be differentially re-excited, so that the nuclei near the low end of the gradient begin to precess at a faster rate, and those at the high end pick up even more speed. When these nuclei relax again, the fastest ones (those which were at the high end of the gradient) will emit the highest frequency of radio waves.

Collectively, the gradient coils allow the MR signal to be spatially encoded, so that each portion of the area being imaged is uniquely defined by the frequency and phase of its resonance signal. In particular, as the hydrogen nuclei relax, each becomes a miniature radio transmitter giving out a characteristic pulse that changes over time, depending on the local microenvironment in which it resides. For example, hydrogen nuclei in fats have a different microenvironment than do those in water, and thus transmit different pulses. Due to these differences, in conjunction with the different water-to-fat ratios of dissimilar tissues, different tissues transmit radio signals of different frequencies. During its receive cycle, the body coil detects these miniature radio transmissions, which are often collectively referred to as the MR signal. From the body coil, these unique resonance signals are conveyed to the receivers of the MR system where they are converted into mathematical data corresponding thereto. The entire procedure must be repeated multiple times to form an image with a good signal-to-noise ratio (SNR). Using multidimensional Fourier transformations, an MR system can convert the mathematical data into a two- or even a three-dimensional image.

When more detailed images of a specific part of the body are needed, a local coil is often used instead of the whole body coil. A local coil can take the form of a volume coil or a surface coil. A volume coil is used to surround or enclose the volume to be imaged (e.g., a head, an arm, a wrist, a leg, or a knee). A surface coil, however, is merely placed upon the surface of a patient so that the underlying region of interest (e.g., the abdominal, thoracic and/or pelvic regions) can be imaged. In addition, a local coil can be designed to operate either as a receive-only coil or a transmit/receive (T/R) coil. The former is only capable of detecting the MR signals produced by the body in response to an MRI procedure, as noted above. A T/R coil, however, is capable of both receiving the MR signals as well as transmitting the RF pulses that produce the RF B1 magnetic field, which is the prerequisite for inducing resonance in body tissue.

It is well known in the field of MRI to use a single local coil, whether surface or volume, to detect the MR signals. According to the single coil approach, a relatively large local coil is used to cover or enclose the entire region of interest. Early receiving coils were just linear coils, meaning that they could detect only one of the two (i.e., vertical MX' and horizontal MY') quadrature components of the MR signals produced by the region of interest. One example of a linear coil is the single loop coil shown in FIG. 1A. This loop is only capable of detecting magnetic fields (i.e., MR signals) that are oriented perpendicular/vertical to the plane of the loop as shown in FIG. 1B. Another example of a linear coil is the butterfly or saddle coil shown in FIG. 2A. Unlike the single loop, the butterfly coil is only sensitive to magnetic fields that are oriented parallel to the plane of the coil as shown in FIG. 2B. This is because a butterfly coil is constructed by twisting a loop in the middle to form two identical subloops about a midpoint. Because the currents flowing in the subloops are the same but flow in counter-rotating directions, the magnetic flux generated by the current flowing through one subloop of the symmetric structure is equal but opposite to the flux due to the current in the other subloop. Therefore, about the midpoint of the structure, the vertical fields, due to the counter-rotating currents, oppose and thus cancel each other. The horizontal fields generated by those currents, however, combine, yielding a magnetic field that is oriented parallel to the plane of the coil.

Accordingly, receiving coils employing quadrature mode detection, meaning that they could intercept both the vertical and horizontal components, have been developed. Compared to linear receiving coils, quadrature receiving coils enabled MRI systems to provide images for which the SNR was much improved, typically by as much as 41%. Even with the improvement brought with quadrature mode detection, the single coil approach still provided images whose quality invited improvement. The disadvantage inherent to the single coil approach is attributable to just one coil structure being used to acquire the MR signals over the entire region of interest.

Phased array coils were also developed to overcome the shortcomings with the single coil approach. Instead of one large local coil, the phased array approach uses a plurality of smaller local coils, with each such coil covering or enclosing only a portion of the region of interest. In a system having two such coils, for example, each of the coils would cover or enclose approximately half of the region of interest, with the two coils typically being partially overlapped for purposes of magnetic isolation. The two coils would acquire the MR signals from their respective portions simultaneously, and they would not interact adversely due to the overlap. Because each coil covers only half of the region of interest, each such coil is able to receive the MR signals at a higher SNR ratio for that portion of the region of the interest within its coverage area. The smaller local coils of the phased array thus collectively provide the MRI system with the signal data necessary to generate an image of the entire region of interest that is higher in resolution than what can be obtained from a single large local coil.

One example of a phased array coil is the Gore® torso array produced by W.L. Gore and Associates, Inc. The torso array contains four surface coils, two of which disposed in an anterior paddle and the other two disposed in a posterior paddle. The two paddles are designed to be placed against the anterior and posterior surfaces, respectively, of the patient about the abdominal, thoracic and pelvic regions. The torso array is designed for use with an MR system whose data acquisition system has multiple receivers. The four leads of the torso array, one each from the two anterior surface coils and the two posterior surface coils, can be connected to separate receivers, with each receiver amplifying and digitizing the signal it receives. The MR system then combines the digitized data from the separate receivers to form an image whose overall SNR is better than what could be obtained from a single local coil, or even two larger anterior and posterior local coils, covering the entire region of interest alone.

It is also well known to obtain images of internal bodily structures through the use of intracavity probes. An example of a prior art intracavity probe designed primarily for use with 1.0 T and 1.5 T MR systems can be found in U.S. Pat. Nos. 5,476,095 ('095) and 5,355,087 ('087), both of which are assigned to the assignee of the present invention and incorporated herein by reference. The prior art probe disclosed is designed to be inserted into bodily openings, such as the rectum, vagina, and mouth. These patents also disclose interface devices that are designed to interface the prior art intracavity probe with MR imaging and spectroscopy systems. A method of using the intracavity probe is disclosed in U.S. Pat. No. 5,348,010, which is also assigned to the assignee of the present invention and incorporated herein by reference.

The prior art probe, operated in conjunction with its associated interface unit, allows an MR system to generate images of, and spectroscopic results for, various internal bodily structures, such as the prostate gland, colon or cervix. Examples of such prior art probes include the BPX-15 prostate/endorectal coil (E-coil), the PCC-15 colorectal coil, and the BCR-15 cervix coil, all of which are part of the eCoil™ line of disposable coils produced by MEDRAD, Inc. of Indianola, Pa. Examples of such interface units include the ATD-II and the ATD-Torso units, also produced by MEDRAD, Inc.

The ATD-II unit is used to interface the prior art probe with one receiver of an MR system to provide images or spectra of the region of interest, namely, the prostate gland, colon or cervix. The ATD-Torso unit is used to interface not only the prior art probe but also the Gore® torso array with multiple receivers of the MR system. When connected to such a probe and the torso array, the ATD-Torso unit allows the MR system to provide images or spectra not only of the prostate gland, colon or cervix but also of the surrounding anatomy, i.e., the abdominal, thoracic and pelvic regions.

U.S. Pat. No. 7,747,310 and U.S. Patent Application Publication No. 2009/0076378, both of which are assigned to the assignee of the present invention and incorporated herein by reference, disclose several intracavity probes, and associated interface devices, for use with MR systems designed to operate at higher field strengths than the prior art probes of the '087 and '095 patents. For example, the latter reference teaches a probe having a coil loop that includes two drive capacitors and a tuning capacitor, all of which in series. Connected across each drive capacitor is an output cable having an electrical length of $S_L+n(\lambda/4)$. When each output cable is connected at its other end to the interface device, the coil loop is thereby interconnected through the interface device to the MR system. U.S. Patent Application Publication No. 2009/0076378 also discloses an intracavity probe having a plurality of such coil loops deployed in a phased array configuration in which each coil loop is critically overlapped by its neighbor.

In addition, quadrature intracavity probes have been developed. For instance, International Patent Application Publication No. WO 2010/056911, which is assigned to the assignee of the present invention and is incorporated herein by reference, discloses a single coil structure that is sensitive to both the vertical and horizontal components of the MR signal by virtue of a simple loop-type coil element and a butterfly-type coil element that share a center conductor. By virtue of its tuning scheme, this single coil structure enables its simple loop and butterfly elements to detect MR signals orthogonal and parallel, respectively, to the plane of the coil.

Despite their widespread acceptance and good reputation in the marketplace, these prior art intracavity probes and interfaces devices nevertheless have a few shortcomings. For example, they offer limited coverage, exhibit lower signal-to-noise performance and generally provide less overall flexibility as compared to the whole focus endorectal coil technology discussed hereinafter. It is therefore desirable to provide an endorectal coil array and associated interface devices capable of providing greater overall flexibility and higher quality images and spectroscopic results from MR signals obtained from nuclei during MR procedures.

SUMMARY OF THE INVENTION

Therefore, it is an object of the present invention to provide a method and system that overcome some or all of the drawbacks and deficiencies evident in the prior art. More specifically, the endorectal coil array and associated interface devices of the present invention are capable of providing greater overall flexibility and higher quality images and spectroscopic results from MR signals obtained from nuclei during MR procedures.

Accordingly, provided is a coil for use with a magnetic resonance (MR) system for obtaining images or spectra of a region of interest. The coil includes an outer loop having a first end and a second end formed from a conductive material for detecting MR signals oriented vertical to a plane of the coil. The outer loop has a plurality of capacitors therein including: (i) a first drive capacitor and a second drive capacitor of approximately equal value serially deployed within the outer loop at the first end of the outer loop with a junction node therebetween; and (ii) a third drive capacitor and a fourth drive capacitor serially deployed within the outer loop at the second end of the outer loop with a junction node therebetween. The coil also includes a first center conductor extending between and evenly bisecting the junction nodes of the outer loop and a second center conductor extending perpendicular to the first center conducter and evenly bisecting the outer loop. The first center conductor has two capacitors symmetrically deployed along its length, and the second center conductor has two capacitors symmetrically deployed along its length. The first center conductor and the second center conductor form four subloops within the outer loop such that switching circuitry in an interface device connectable to the coil is configurable to selectively ignore or detect output from at least one of the four subloops, thereby allowing a scanner coupled to the interface device to produce images in a plurality of different modes.

The plurality of different modes may be selected from the group consisting of: Whole Loop, Whole Saddle, Whole Loop and Whole Saddle, Focus UP, Focus DOWN, Focus LEFT, Focus RIGHT, and Focus ALL. Each of these modes will be discussed in greater detail hereinafter.

The coil may further include a first output line having a first pair of coaxial cables with both shield wires of the first pair of coaxial cables connected to the junction node between the first drive capacitor and the second drive capacitor and the central signal conductors of the first pair of coaxial cables connected across the first and the second drive capacitors, respectively; and a second output line having a second pair of coaxial cables with both shield wires of the second pair of coaxial cables connected to the junction node between the third drive capacitor and the fourth drive capacitor and the central signal conductors of the second pair of coaxial cables connected across the third and the fourth drive capacitors, respectively. Each coaxial cable may have a nominal impedance of 50 ohms and an electrical length of $S_L+n(\lambda/4)$ where $S_L$ is a supplemental length whose reactance is of a same magnitude as a reactance of the drive capacitor corresponding thereto, n is an odd integer, and $\lambda$ is a wavelength of the operating frequency of the MR system. The first pair of coaxial cables and the second pair of coaxial cables may terminate in at least one plug for connecting the coil to the interface device.

Also provided is an intracavity probe for use with a MR system for obtaining images or spectra of a region of interest within a cavity of a patient. The intracavity probe includes a coil having an outer loop having a first end and a second end formed from a conductive material for detecting MR signals oriented vertical to a plane of the coil. The outer loop has a plurality of capacitors therein including: (i) a first drive capacitor and a second drive capacitor of approximately equal value serially deployed within the outer loop at the first end of the outer loop with a junction node therebetween; and (ii) a third drive capacitor and a fourth drive capacitor serially deployed within the outer loop at the second end of the outer loop with a junction node therebetween. The coil also includes a first center conductor extending between and evenly bisecting the junction nodes of the outer loop and a second center conductor extending perpendicular to the first center conducter and evenly bisecting the outer loop. The first center conductor has two capacitors symmetrically deployed along its length, and the second center conductor has two capacitors symmetrically deployed along its length. The first center conductor and the second center conductor form four subloops within the outer loop, such that switching circuitry in an interface device connectable to the coil is configurable to selectively ignore or detect output from at least one of the four subloops, thereby allowing a scanner coupled to the interface device to produce images in a plurality of different modes.

In addition, provided is a system for obtaining images or spectra of a region of interest. The system includes a coil having an outer loop having a first end and a second end formed from a conductive material for detecting MR signals oriented vertical to a plane of the coil. The outer loop has a plurality of capacitors therein including: (i) a first drive capacitor and a second drive capacitor of approximately equal value serially deployed within the outer loop at the first end of the outer loop with a junction node therebetween; and (ii) a third drive capacitor and a fourth drive capacitor serially deployed within the outer loop at the second end of the outer loop with a junction node therebetween. The coil also includes a first center conductor extending between and evenly bisecting the junction nodes of the outer loop and a second center conductor extending perpendicular to the first center conductor and evenly bisecting the outer loop. The first center conductor has two capacitors symmetrically deployed along its length, and the second center conductor has two capacitors symmetrically deployed along its length. The system also includes an interface device for interfacing the coil with a magnetic resonance (MR) system. The interface device includes a first interface device module and a second interface device module. The first interface device module includes: a first phase shifting network connectable across the third drive capacitor of the coil that enables a phase of the signals received therefrom to be shifted by a predetermined angle; a second phase shifting network connectable across the fourth drive capacitor of the coil enables a phase of the signals received therefrom to be shifted by the predetermined angle; a first switching network of the first interface device module that includes a first switching device for directing an output from the first phase shifting network and a second switching device for directing an output of the second phase shifting network; a mode splitter of the first interface device module configured to receive an input from the first switching network; and a second switching network of the first interface device module that includes a third switching device and a fourth switching device. The third switching device is provided to receive an output from one of the first switching device and the mode splitter and send the output to a first receiver of the MR system. The fourth switching device is provided to receive an output from one of the second switching device and the mode splitter and send the output to a second receiver of the MR system. The second interface device module includes: a third phase shifting network connectable across the first drive capacitor of the coil that enables a phase of the signals received therefrom to be shifted by the predetermined angle; a fourth phase shifting network connectable across the second drive capacitor of the coil enables a phase of the signals received therefrom to be shifted by the predetermined angle; a first switching network of the second interface device module that includes a first switching device for directing an output from the third phase shifting network and a second switching device for directing an output of the fourth phase shifting network; a mode splitter of the second interface device module configured to receive an input from the first switching network; and a second switching network of the second interface device module that includes a third switching device and a fourth switching device. The third switching device is provided to receive an output from one of the first switching device and the mode splitter and send the output to a third receiver of the MR system. The fourth switching device is provided to receive an output from one of the second switching device and the mode splitter and send the output to a fourth receiver of the MR system. The switching networks of the first interface device module and the switching networks of the second interface device module are configured to allow the MR system to selectively ignore or detect the output from at least one of the third switching device of the first interface device module, the fourth switching device of the first interface device module, the third switching device of the second interface device module and the fourth switching device of the second interface device module, thereby allowing the MR system connected to the interface device to produce images in a plurality of different modes.

The first interface device module may further include a first preamplifier disposed between the first phase shifting network and the first switching device of the first interface device module; and a second preamplifier disposed between the second phase shifting network and the second switching device of the first interface device module. The second interface device module may further include a third preamplifier disposed between the third phase shifting network and the first switching device of the second interface device module; and a fourth preamplifier disposed between the fourth phase shifting network and the second switching device of the second interface device module. In addition, the predetermined angle may be 90 degrees.

These and other features and characteristics of the present invention, as well as the methods of operation and functions of the related elements of structures and the combination of parts and economies of manufacture, will become more apparent upon consideration of the following description and the appended claims with reference to the accompanying drawings, all of which form a part of this specification, wherein like reference numerals designate corresponding parts in the various figures. It is to be expressly understood, however, that the drawings are for the purpose of illustration and description only and are not intended as a definition of the limits of the invention. As used in the specification and the claims, the singular form of "a", "an", and "the" include plural referents unless the context clearly dictates otherwise.

BRIEF DESCRIPTION OF THE DRAWINGS

FIG. 21 is a block diagram of the interface device of FIG. 4 illustrating the manner in which the interface device operates when in Focus LEFT mode;

DETAILED DESCRIPTION OF THE PRESENT INVENTION

Figure 1A:
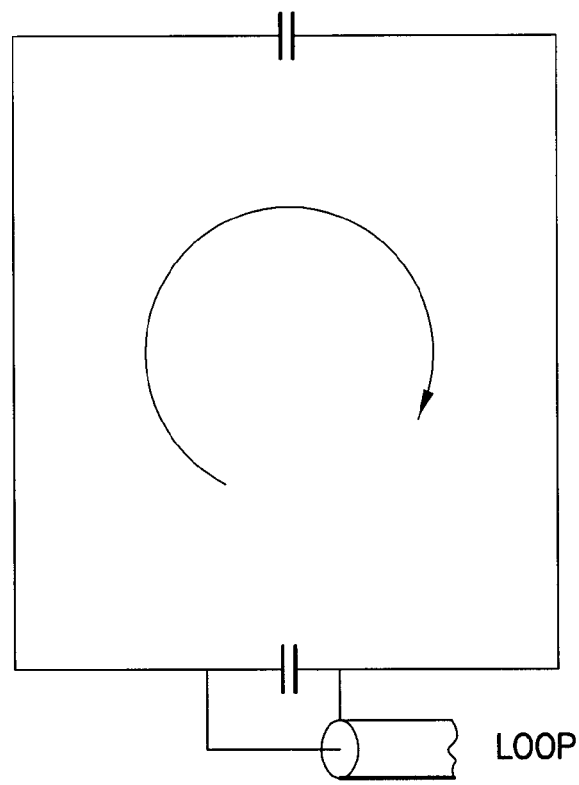
FIG. 1A is a schematic diagram of a conventional single loop coil and FIG. 1B is a representation of the vertically oriented magnetic fields it is capable of sensing.
Figure 1B:
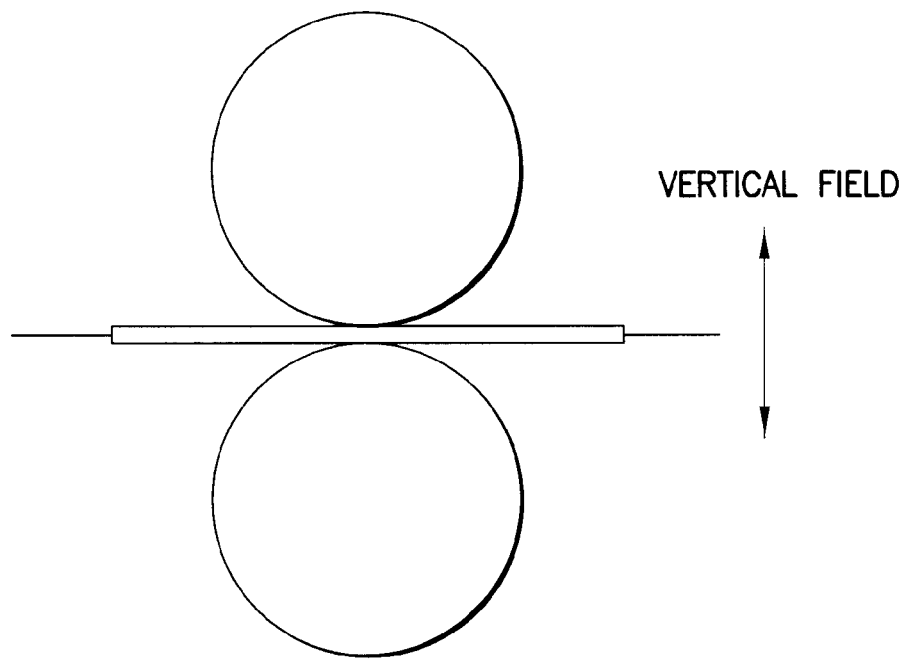
Figure 2A:
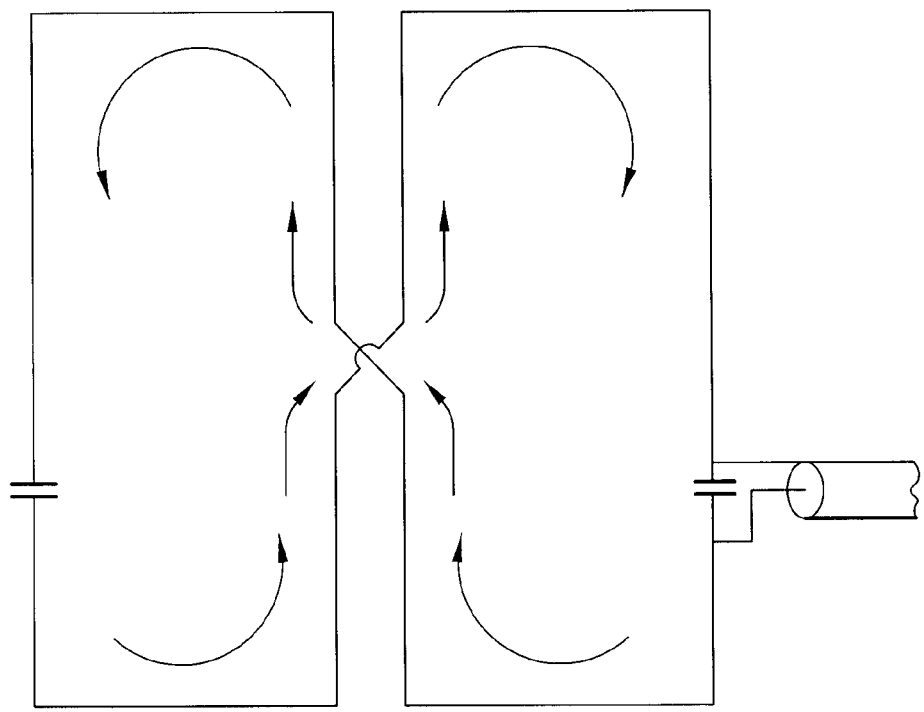
FIG. 2A is a schematic diagram of a butterfly coil and FIG. 2B is a representation of the horizontally oriented magnetic fields it is capable of sensing.
Figure 2B:
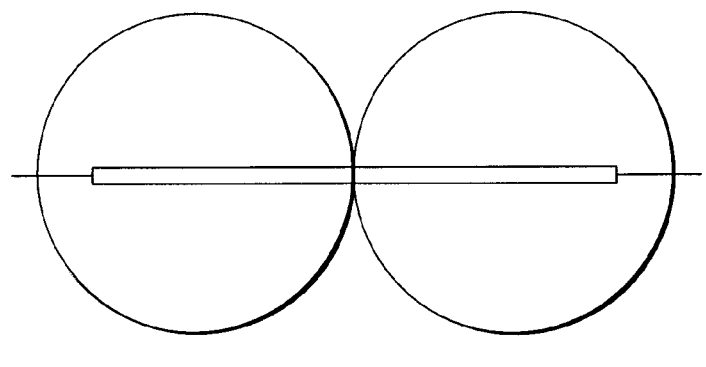

For purposes of the description hereinafter, the terms "upper", "up", "lower", "down" "right", "left", "vertical", "orthogonal", "horizontal", "top", "bottom", "lateral", "longitudinal", and derivatives thereof shall relate to the invention as it is oriented in the drawing figures and/or from the perspective of a patient during a procedure. However, it is to be understood that the invention may assume alternative variations and step sequences, except where expressly specified to the contrary. It is also to be understood that the specific devices and processes illustrated in the attached drawings, and described in the following specification, are simply exemplary embodiments of the invention. Hence, specific dimensions and other physical characteristics related to the embodiments disclosed herein are not to be considered as limiting.

In all of its embodiments and related aspects, the present invention disclosed below is ideally used with magnetic resonance (MR) systems designed to operate at 1.0, 1.5, or 3.0 Tesla or any field strength in between, though it is also applicable to those operable at lower or higher field strengths. The technology is also applicable to scanner configurations with horizontal or vertical bore magnets or other orientations and in closed or open bore scanners. In addition, the MR images discussed hereinafter were obtained by a suitable multiple receiver MR scanner such as the Sigma® HDxt Scanner manufactured by GEMS.

Although the invention is described herein in a specific implementation, i.e., as an endorectal coil array, which is capable of being incorporated within a suitable housing to form an intracavity probe insertable into the rectum to obtain images and/or spectra of the male prostate gland. It should be understood that the invention is equally capable of being adapted to obtain images of and/or spectra from other regions of interest, such as those accessible through the mouth, the vagina or other orifices penetrable by an intracavity probe. It should also be apparent that the principles presented herein may also be applied to a wide variety of surface coil arrays, such as those intended for imaging of the neck, torso, limbs and other structures of the body.

In view of the increasing availability of multi-channel MRI scanners, the capabilities of a multi-channel endorectal coil design is described below in comparison to the single-channel endorectal coils known in the art. In this case, a 1.5 T 4-channel endorectal coil prototype was constructed using a "common-conductor" method that relies upon electrical isolation of the individual elements. It has the same width and is 30% longer than prior art endorectal coils.

Figure 3:
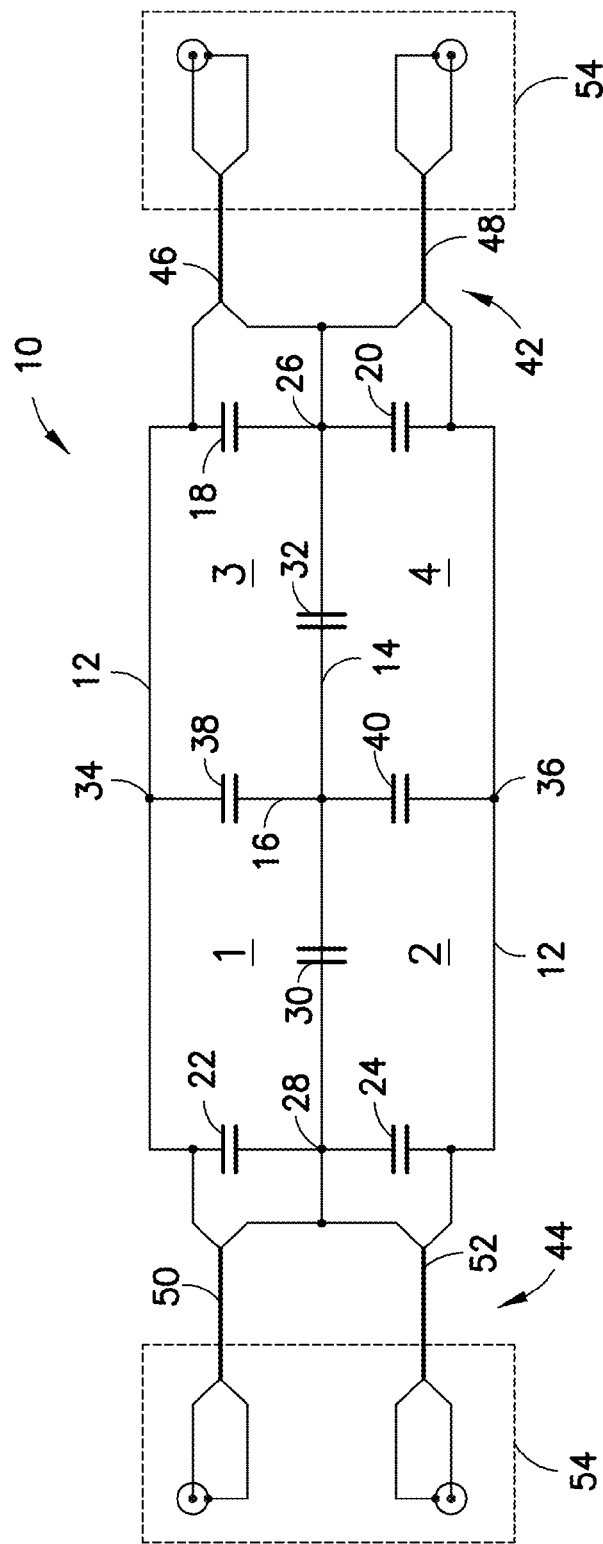
FIG. 3 is a schematic diagram of a four channel phased array endorectal coil having common conductors in accordance with the present invention.

With specific reference to FIG. 3, various aspects of this "common-conductor" endorectal coil array are illustrated. More specifically, FIG. 3 illustrates a schematic of a prototype of the common-conductor endorectal coil array built for operation with 1.5 T MRI scanners.

The endorectal coil, generally denoted as reference numeral 10, includes an outer loop 12 having a generally rectangular shape, a first center conductor 14 bisecting outer loop 12 in the Z plane, and a second center conductor 16 bisecting outer loop 12 in the X plane. First and second conductors 14, 16 divide the center loop into four "subloops" or elements 1-4. Outer loop 12 includes a plurality of capacitors including first and second drive capacitors 18 and 20 and third and fourth drive capacitors 22 and 24. Of approximately equal values, the drive capacitors 18, 20, 22, and 24 are serially deployed within outer loop 12. As discussed in greater detail hereinafter, in certain modes, drive capacitors 18 and 20 or drive capacitors 22 and 24 form a virtual ground at their junction nodes 26 and 28, respectively, for electrically balancing and impedance matching the loop. Outer loop 12 also includes four inductors (not shown) formed by the inductances inherent in the conductive (e.g., copper) segments of the loop. The values of the capacitors in outer loop 12 have been chosen so that the capacitive reactances of the loop are equal in magnitude to the inductive reactances of the loop at the operating frequency. Discrete inductors may also be incorporated into outer loop 12 for that purpose.

In this manner, the outer loop 12 of FIG. 3 has been tuned to detect MR signals emanating from the patient at the operating frequency of a 1.5 T MR system. The shape of outer loop 12 dictates that the loop is capable of detecting only those MR signals whose field lines are oriented vertical to the plane of the loop. The aforementioned positioning of capacitors 18, 20, 22, and 24, however, also imposes a 180 degree phase shift upon the resulting voltage signals output by outer loop 12, representative of the vertically oriented MR signals it detects. The significance of this phase differential becomes apparent in connection with the operation of the interface device discussed below.

The first center conductor 14 extends between and evenly bisects the junction nodes 26, 28 of outer loop 12, and thus maintains the physical and electrical symmetry of coil 10. FIG. 3 shows the first center conductor 14 as having two capacitors 30, 32 symmetrically deployed along its length. In addition, like outer loop 12, first center conductor 14 includes inductors represented by the inductances inherent in the conductor. The second center conductor 16 extends between and evenly bisects the nodes 34, 36 of outer loop 12, and thus also maintains the physical and electrical symmetry of coil 10. FIG. 3 shows the second center conductor 16 as having two capacitors 38, 40 symmetrically deployed along its length. In addition, like outer loop 12, first center conductor 16 includes inductors represented by the inductances inherent in the conductor.

Due to the desire for a small, flexible, damage-resistant intracavity probe whose design minimizes the likelihood of any internal componentry protruding through the balloon-type enclosure in which it is housed, coil 10 of the present invention may be constructed of a thin, flexible dielectric material with copper patterns applied to both sides to form not only the conductive pathways but also all of the capacitors required for tuning and decoupling. Moreover, as coil 10 is intended to be offered as an integral part of a one-use disposable intracavity probe, such a fabrication technique will aid in the goal of realizing substantial savings during the manufacture of the probes. This is because the fabrication process for "preprinted" coils will involve significantly less labor and less time to inspect the finished product as compared to coils made from discrete components.

Coil 10 further includes a first output line 42 and a second output line 44. Output lines 42, 44 for coil 10 may be implemented using various mechanisms, such as coaxial cable, stripline, microstrip or other transmission line technologies. FIG. 3 shows first output line 42 and second output line 44, each implemented as a pair of coaxial cables. First output line 42 includes two coaxial cables 46 and 48 with the shield conductor of each connected to junction node 26 of the coil 10. The center conductor of cable 46 connects to the other side of first drive capacitor 18, while the center conductor of cable 48 connects to the other side of second drive capacitor 20. Second output line 44 also includes two coaxial cables 50 and 52 with the shield conductor of each connected to junction node 28 of the coil 10. The center conductor of cable 50 connects to the other side of third drive capacitor 22, while the center conductor of cable 52 connects to the other side of fourth drive capacitor 24.

However implemented, the output lines 42 and 44 should have an electrical length of $S_L+n(\lambda/4)$ for the reasons disclosed in U.S. application Ser. No. 11/719,253 (253) (published as U.S. Patent Application Publication No. 2009/0076378A1), which is assigned to the assignee of the present invention and incorporated herein by reference. As disclosed in the '253 application, $\lambda$ is the wavelength of the operating frequency of the MR system and n is an odd integer whose value will typically be (and is hereinafter treated as being) equal to 1 as the coil 10 will, in practice, always be reasonably close to the interface device to which it will connect. $S_L$ represents an additional length whose inductive reactance is of the same magnitude as the reactance of each of the first and second drive capacitor 18, 20 across which the terminals of output line 42 connect or of the third and fourth drive capacitors 22, 24 across which the terminals of output line 44 connect. The coaxial cable length is chosen so that a high impedance at the interface coax connector results in an inductive remnant that resonates with the drive capacitor, a parallel-resonant circuit is formed at each drive point in this case. This decouples the entire array from the transmit field, preventing induced current flow and heating of the array, preventing a hazard to the patient.

Using the two coaxial cable option for forming output line 42 as an example, with an electrical length of $S_L+(\lambda/4)$ for the center and shield conductors of each, each coaxial cable 46 and 48 is designed to be connectable to a 90 degree phase shifting network. For that reason, the interface device disclosed below features four such phase shifting networks, one for each coaxial cable 46, 48, 50, and 52 of coil 10. With a standard plug affixed to the end of each cable (or with a single 2-channel connector 54 accommodating the conductors of both cables), the center and shield conductors of each cable 46 and 48 (or cables 50 and 52) connect to a suitable socket or other type connector for the interface device so as to connect each cable to its corresponding phase shifting network in the interface device.

Figure 4:
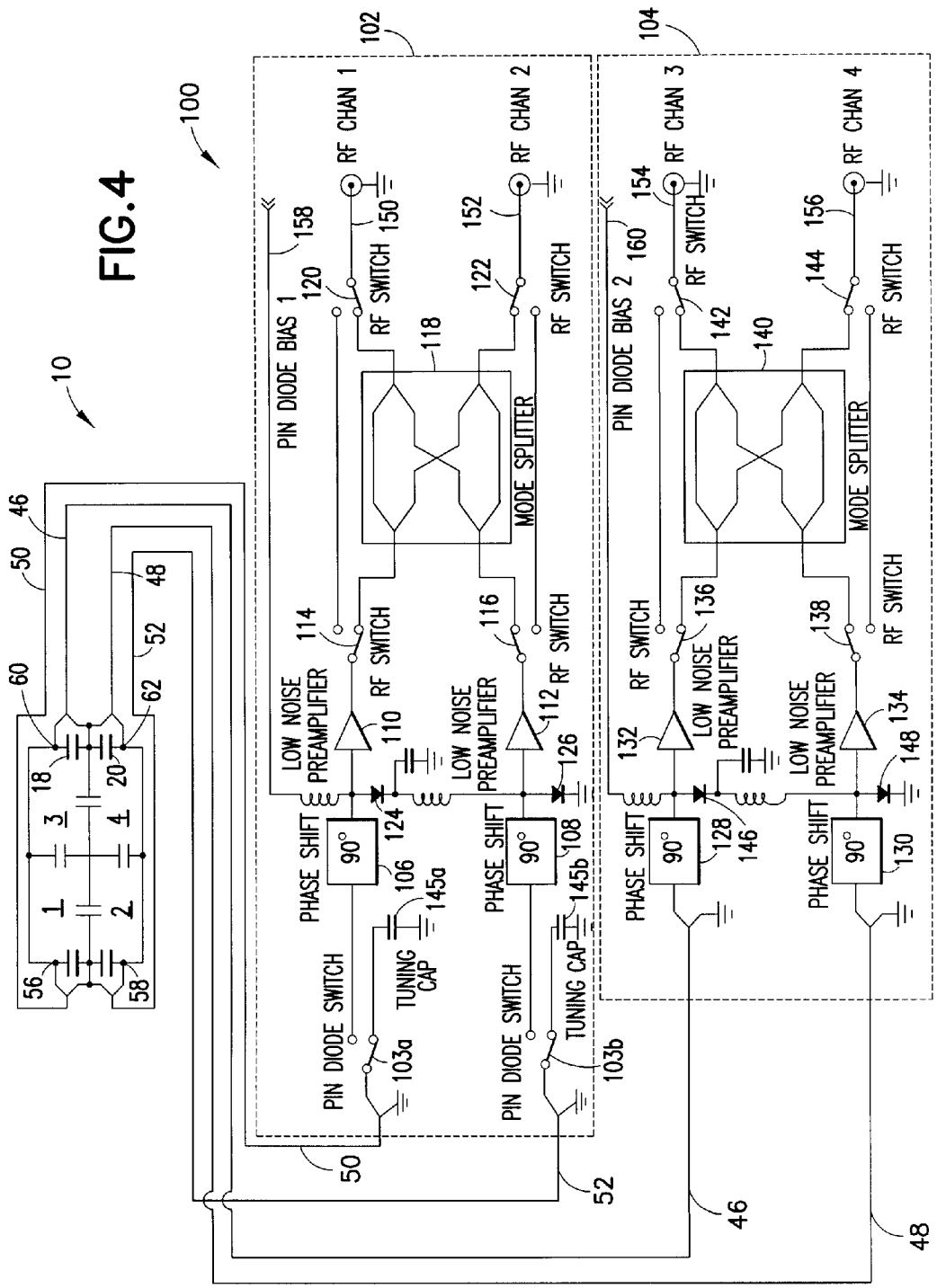
FIG. 4 is a block diagram of the four channel phased array endorectal coil of FIG. 3 and a related multiplexing interface device in accordance with the present invention.

With reference to FIG. 4 and with continuing reference to FIG. 3, an embodiment of an interface device, generally denoted as reference numeral 100, for interfacing the coil 10 with the appropriate input port(s) of a 1.5 T MR system is illustrated.

The interface device 100 includes a first interface module 102 and a second interface module 104. The first interface module 102 includes PIN diode switches 103a and 103b, phase shifting networks 106 and 108, preamplifier networks 110 and 112, a first switching network that includes a first switching device 114 and a second switching device 116, a mode splitter 118, and a second switching network that includes a third switching device 120, and a fourth switching device 122. The second interface module 104 includes phase shifting networks 128 and 130, preamplifier networks 132 and 134, a first switching network that includes a first switching device 136 and a second switching device 138, a mode splitter 140, and a second switching network that includes a first switching device 142 and a second switching device 144. While phase shifting networks 106, 108, 128, and 130 are described hereinafter as 90 degree phase shifting networks, this is not to be construed as limiting the present invention as the phase shifting networks may be configured to shift the signal by other predetermined angles.

The PIN diode switches 103a, 103b in the first interface module 102 function as a method to apply signals from the coil drive capacitors 22 and 24 to the phase shift networks, preamplifiers and mode splitters when utilizing the corresponding coil elements 1 and 2 in conjunction with coil elements 3 and 4 in various modes to be specified below. Alternately, the PIN diode switches 103a, 103b can be set to connect capacitors 145a and 145b across both coaxial cables 50 and 52 at the interface end. The value of these capacitors 145a and 145b, as applied through the coaxial cables 50 and 52 to the drive capacitors 22 and 24 was chosen to alter the capacitance of the capacitors 22 and 24 so that they no longer block the flow of RF current in the outer conductor, and function as tuning capacitors to encourage current flow in the outer conductor at the Larmor frequency. The PIN diode switches 103a and 103b always operate in tandem.

The preamplifier networks 110, 112, 132, and 134 may ideally be realized with 28 dB nominal gain and may be implemented using commercially available miniature low-noise, 28 dB gain shielded units with a tuned input circuit designed to present a low impedance (<5Ω real) at the Larmor frequency. Close proximity of the preamplifier networks 110, 112, 132, and 134 to their respective PIN diodes 124, 126, 146, and 148 in view of the low impedance of the former allows some measure of isolation during the receive cycle from other surface coils (or arrays of same) used in conjunction with coil 10. Passive protection diode networks (not shown) may be included in interface device 100 to prevent excessive RF voltage from damaging the preamplifier networks 110, 112, 132, and 134 during the RF transmit pulse should interface device 100 be disconnected while inside the bore of the MR system during the transmit cycle. These diode networks also provide some decoupling for coil 10 in the same scenario.

The mode splitters 118, 140 are provided to extract the various "Vertical" and "Horizontal" modes as discussed in greater detail hereinafter. The mode splitters 118, 140 each include a pair of zero degree power splitting networks (not shown), a 180 degree combining network and a zero degree combining network (not shown). Each of the power splitting networks has one input and a pair of outlets and each of the combining networks has a pair of inlets and one outlet. With reference to the first interface device module 102, each of the power splitting networks are used as 50 ohm/0 degree splitters. The two combining networks are also configured as 50 ohm devices. The input of a first one of the power splitting networks is coupled to the output of the preamplifier network 110 via first switching device 114. One of the outputs of this power splitting network is coupled to one of the inputs of the 180 degree power combining network and the other output is coupled to one of the inputs of the zero degree power combining network. The input of a second one of the power splitting networks is coupled to the output of the preamplifier network 112 via second switching device 116. One of the outputs of this power splitting network is coupled to one of the inputs of the 180 degree power combining network and the other output is coupled to one of the inputs of the zero degree power combining network. The output of the 180 degree power combining network is coupled to third switching device 120 and the output of the 0 degree power combining network is coupled to the fourth switching device 122.

The first one of the power splitting networks passes amplified versions of the 90 degree horizontal voltage signals and 90 degree vertical voltage signals to both the 180 degree combining network and zero degree combining network. Similarly, the second one of the power splitting networks passes amplified versions of the 90 degree horizontal voltage signals and −90 degree vertical voltage signals to both the 180 degree combining network and zero degree combining network. Because the horizontal voltage signals received from the power splitting networks are in phase, the zero degree combining network is able to constructively combine them. Simultaneously, the zero degree combining network also cancels the 90 degree vertical voltage signals received from the first one of the power splitting networks with the −90 degree vertical voltage signals received from the second one of the power splitting networks. Similarly, because the vertical voltage signals received from the power splitting networks are out of phase by 180 degrees, the 180 degree combining network is able to constructively combine them. The zero degree combining network cancels the horizontal voltage signals received from the first one of the power splitting networks with the horizontal voltage signals received from the second one of the power splitting networks because they are received in phase. Consequently, the zero degree combining network essentially reconstitutes the horizontal voltage signals that had been bifurcated by the design of coil 10, while the 180 degree combining network reconstitutes the vertical voltage signals. The output of the 180 degree combining network is sent to a first channel 150 via third switching device 120 and the output of the zero degree combining network is sent to a second channel 152 via fourth switching device 122.

With reference to the second interface device module 104, each of the power splitting networks are used as 50 ohm/0 degree splitters. The two combining networks are also configured as 50 ohm devices. The input of a first one of the power splitting networks is coupled to the output of the preamplifier network 132 via first switching device 136. One of the outputs of this power splitting network is coupled to one of the inputs of the 180 degree power combining network and the other output is coupled to one of the inputs of the zero degree power combining network. The input of a second one of the power splitting networks is coupled to the output of the preamplifier network 134 via second switching device 138. One of the outputs of this power splitting network is coupled to one of the inputs of the 180 degree power combining network and the other output is coupled to one of the inputs of the zero degree power combining network. The output of the 180 degree power combining network is coupled to third switching device 142 and the output of the 0 degree power combining network is coupled to the fourth switching device 144.

The first one of the power splitting networks passes amplified versions of the 90 degree horizontal voltage signals and 90 degree vertical voltage signals to both the 180 degree combining network and zero degree combining network. Similarly, the second one of the power splitting networks passes amplified versions of the 90 degree horizontal voltage signals and −90 degree vertical voltage signals to both the 180 degree combining network and zero degree combining network. Because the horizontal voltage signals received from the power splitting networks are in phase, the zero degree combining network is able to constructively combine them. Simultaneously, the zero degree combining network also cancels the 90 degree vertical voltage signals received from the first one of the power splitting networks with the −90 degree vertical voltage signals received from the second one of the power splitting networks. Similarly, because the vertical voltage signals received from the power splitting networks are out of phase by 180 degrees, the 180 degree combining network is able to constructively combine them. The zero degree combining network cancels the horizontal voltage signals received from the first one of the power splitting networks with the horizontal voltage signals received from the second one of the power splitting networks because they are received in phase. Consequently, the zero degree combining network essentially reconstitutes the horizontal voltage signals that had been bifurcated by the design of coil 10 while the 180 degree combining network reconstitutes the vertical voltage signals. The output of the 180 degree combining network is sent to a third channel 154 via third switching device 142 and the output of the zero degree combining network is sent to a fourth channel 156 via fourth switching device 144.

The interface device 100 is equipped to perform mode selection functions, as discussed hereinafter in greater detail using RF switching devices 114, 116, 120, 122, 136, 138, 142, and 144 in the first and second switching networks of the first and second interface device modules 102, 104 controlled ultimately by the host scanner, with each mode possibly selectable as a subset of a coil type. During development, various schemes were investigated to implement switching devices 114, 116, 120, 122, 136, 138, 142, and 144 of interface device 100. For example, DC biasing was employed to turn the loops/legs on and off. Hybrid switching and phase combiners were also used in the interface device 100. This involves complex switching, multiplexing circuitry in the interface device, and the use of appropriate configuration files with the scanner.

The first interface module 102 and the second interface module 104 of the interface device 100 each includes two PIN diodes 124, 126, 146, and 148. In the first interface module 102, PIN diode 124 is connected across the output of phase shifting network 106 and PIN diode 126 is connected across the output of phase shifting network 108. In the second interface module 104, PIN diode 146 is connected across the output of phase shifting network 128 and PIN diode 148 is connected across the output of phase shifting network 130. The phase shifting networks each implement a 90 degree (or λ/4 radian) shift of the voltage signals inputted thereto from coil 10 for the reasons specified below.

Having set forth the components of the present invention, the operation of coil 10 and interface device 100 in various modes will be discussed hereinafter with reference to FIGS. 5-28.

Whole Loop Mode

Figure 5:
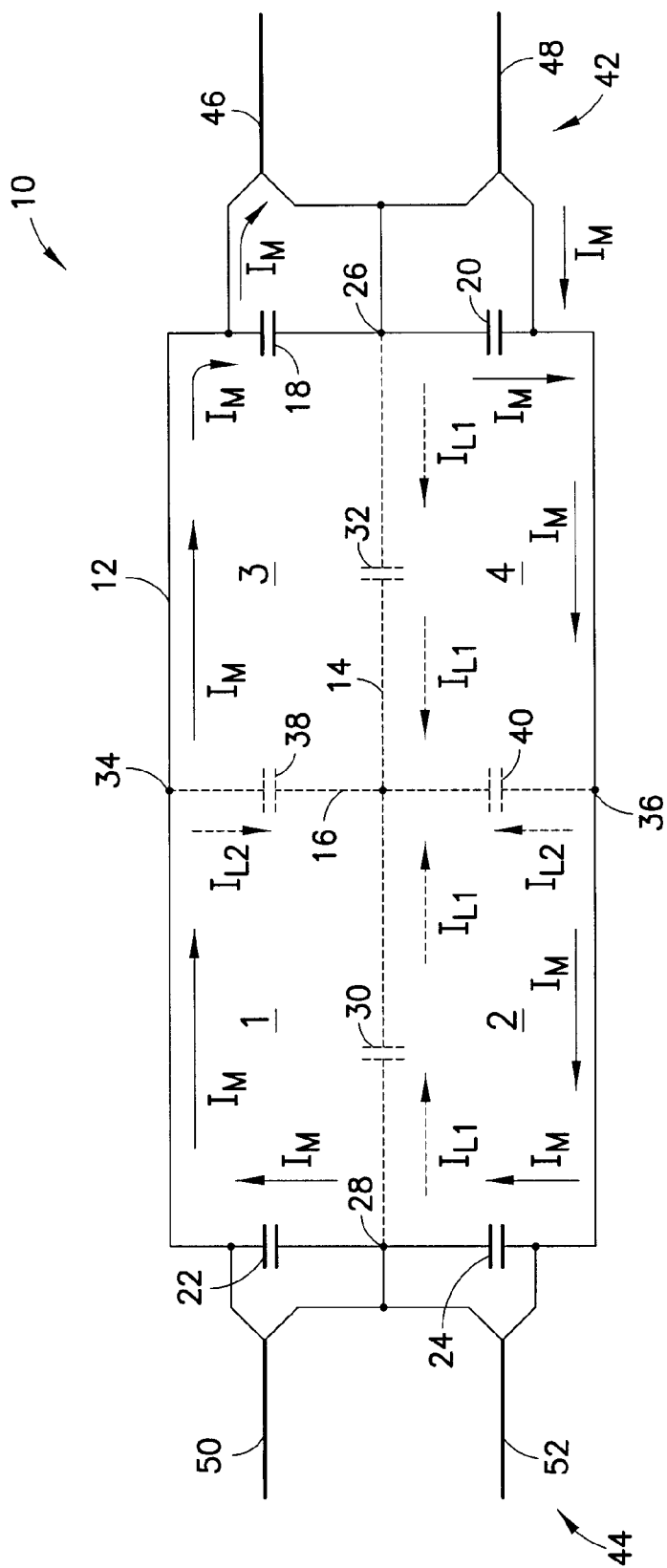
FIG. 5 is a schematic diagram of the coil of FIG. 3 illustrating the manner in which current is induced therein when in Whole Loop mode.
Figure 6:
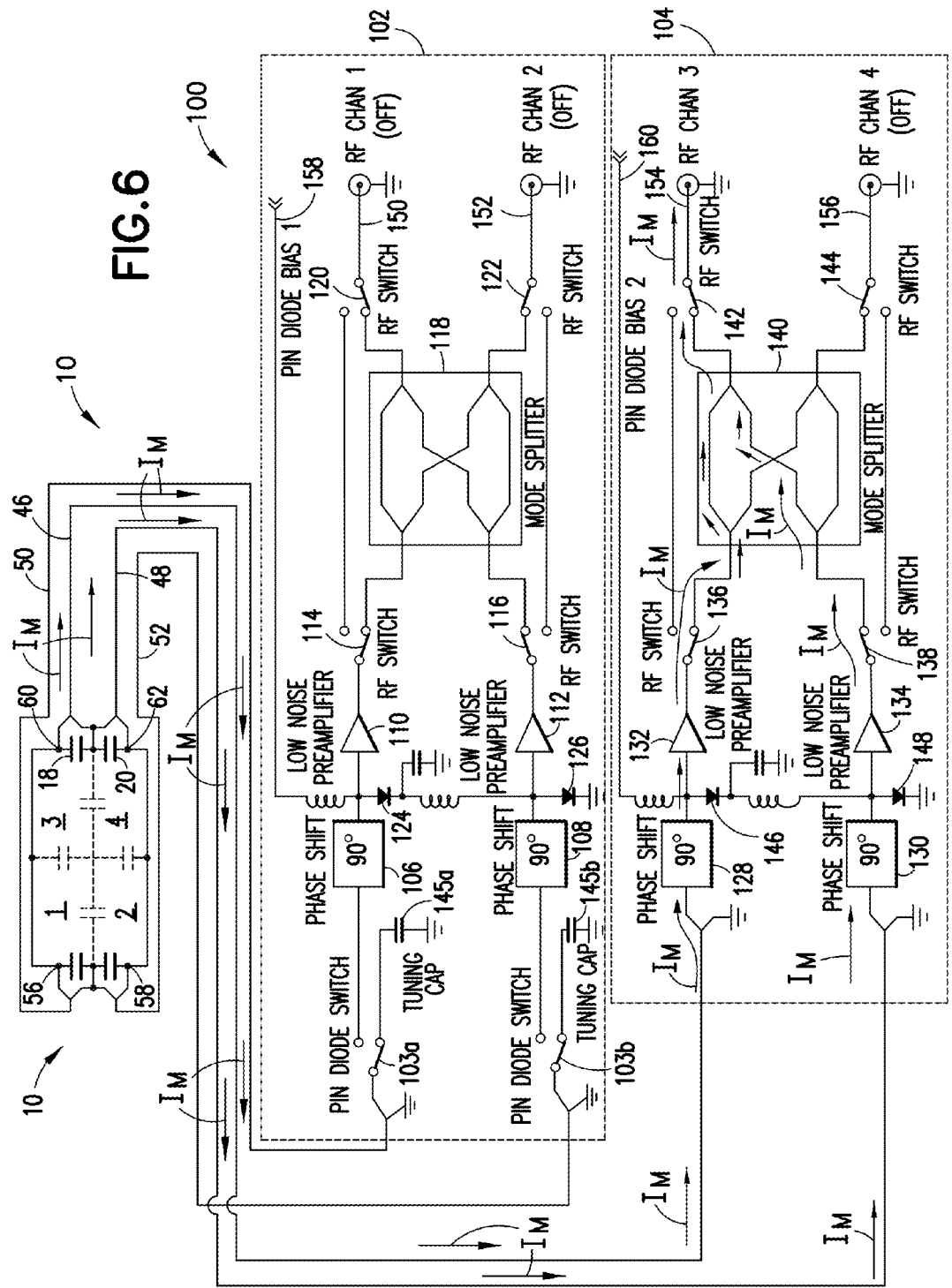
FIG. 6 is a block diagram of the interface device of FIG. 4 illustrating the manner in which the interface device operates when in Whole Loop mode.
Figure 7A:
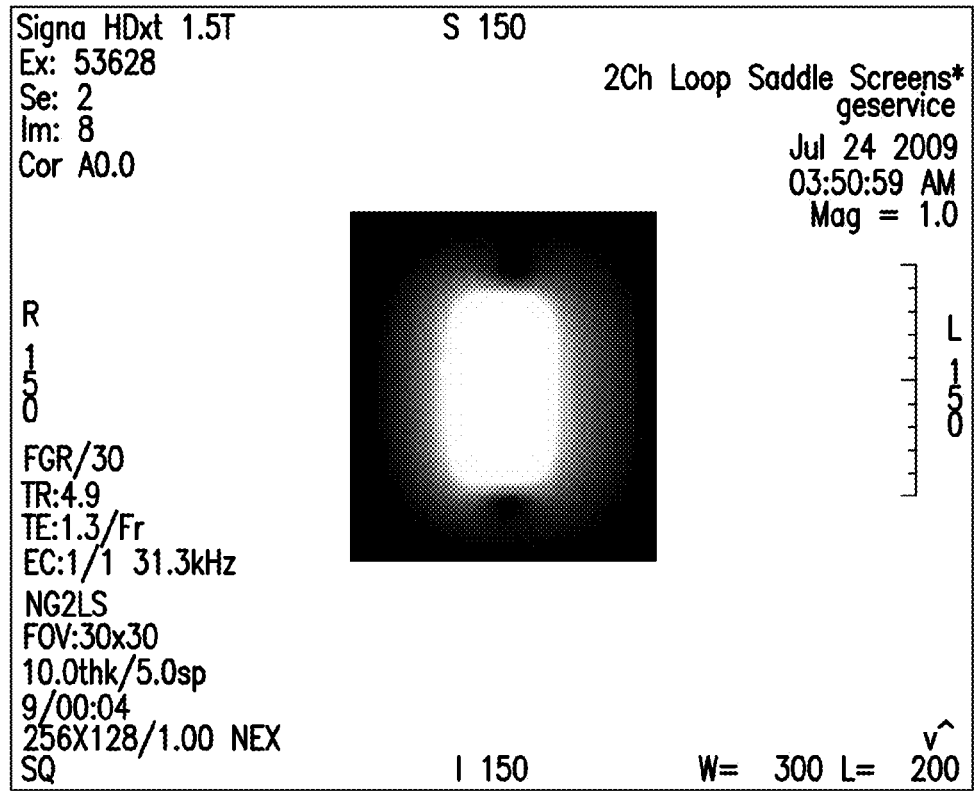
FIG. 7A is an exemplary image produced by an MR system when the coil of FIG. 3 and the interface device of FIG. 4 are operating in Whole Loop mode and FIG. 7B is a schematic diagram of the coil of FIG. 3 illustrating the orientation of the coil to produce the image in FIG. 7A.
Figure 7B:
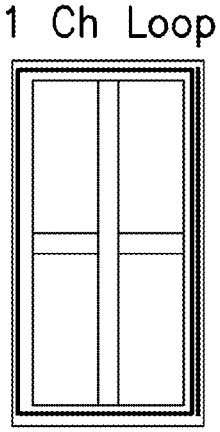

With reference to FIGS. 5-7 and specific reference to FIG. 5, during the receive cycle, the current induced by the vertically oriented MR signals within outer loop 12 can be represented by $I_M$, as it is the signal current shown flowing into and out of the loop.

As the current $I_M$ reach the opposite ends of first center conductor 14, each splits into two currents, one of which remains in outer loop 12 and the other being a first leakage current $I_{L1}$ which may leak into first center conductor 14. In addition, as the current reaches the opposite ends of the second center conductor 16, a second leakage current $I_{L2}$ leaks into second center conductor 16, as shown in FIG. 5. Due to the symmetry of the coil 10, both branches of the first leakage current are equal as are both branches of the second leakage current.

Because each branch of the first leakage current flows into first center conductor 14 from opposite ends of the outer loop 12, they are opposite in sign and, thus, cancel each other out. Likewise, since each branch of the second leakage current flows into second center conductor 14 from opposite ends of the outer loop 12, they are opposite in sign and, thus, cancel each other out.

Accordingly, essentially no net current flows in first center conductor 14 and second center conductor 16 during the receive cycle, thus, enabling first center conductor 14 and second center conductor 16 to act as open circuits relative to the current flowing in outer loop 12. Therefore, first center conductor 14, second center conductor 16, and capacitors 30, 32, 36, and 38 are illustrated in FIG. 5 in phantom.

Having completed discussion of manner in which current flows through coil 10 during a receive cycle when in Whole Loop mode, a description of the operation of interface device 100 during the receive cycle of the MR system when in Whole Loop mode will now be described with specific reference to FIG. 6. Coil 10 outputs voltage signals representative of MR signals of both horizontal and vertical orientation. For ease of description, the voltage signals representative of the MR signals of horizontal orientation are referred to herein as "0 degree horizontal voltage signals" because they have the same phase at each port. The voltage signals representative of the MR signals of vertical orientation are referred to as "0 degree vertical voltage signals" for those output the first port 56 and third port 60 and "180 degree vertical voltage signals" for those output from the second port 58 and fourth port 62.

With continued reference to FIG. 6, the manner in which interface device 100 processes the voltage signals received from output lines 42 and 44 is now described. The combination of configuration files loaded into the host scanner along with switching devices 114, 116, 120, 122, 136, 138, 142, and 144 are provided to allow the host scanner to "turn off" or ignore the output of any one of a first channel 150, a second channel 152, a third channel 154, or a fourth channel 156. When operating in Whole Loop mode, the host scanner is configured to ignore the output of the first channel 150, the second channel 152, and the fourth channel 156. The phase shifting network 128 shifts the 0 degree horizontal voltage signals and the 0 degree vertical voltage signals received from first drive capacitor 18 via output cable 46 to 90 degree horizontal voltage signals and 90 degree vertical voltage signals, respectively. Similarly, phase shifting network 130 shifts the 0 degree horizontal voltage signals and the 180 degree vertical voltage signals received from second drive capacitor 20 via output cable 48 to 90 degree horizontal voltage signals and −90 degree vertical voltage signals, respectively. Preamplifier networks 132 and 134 each amplify the voltage signals they receive and pass the resulting amplified versions to first and second switching devices 136 and 138, respectively. The positions of first and second switching devices 136 and 138 are controlled by configuration files in the scanner First and second switching devices 136 and 138 can be positioned to either send the signals to the mode splitter 140 or to bypass the mode splitter 140. In Whole Loop mode, both signals are fed to the mode splitter 140 where the signals are appropriately combined and output to the host scanner via third channel 154. As discussed above, the output of the first channel 150, the second channel 152, and the fourth channel 156 are ignored by the host scanner The flow of current through interface device 100 is shown by arrows $I_M$ in FIG. 6.

Accordingly, an image as shown in FIG. 7A is produced by the host scanner when in Whole Loop mode based on the signal received from interface device 100.

Whole Saddle Mode

Figure 8:
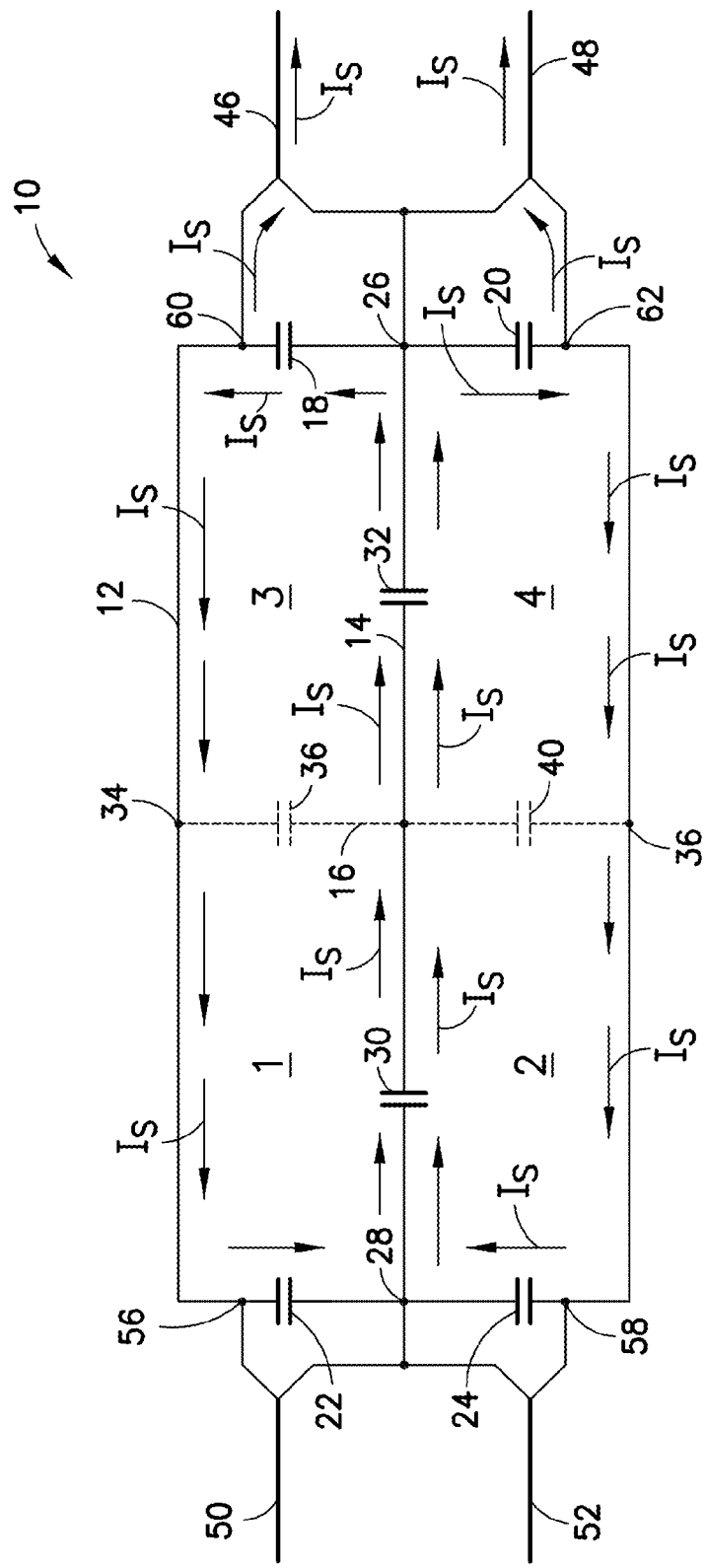
FIG. 8 is a schematic diagram of the coil of FIG. 3 illustrating the manner in which current is induced therein when in Whole Saddle mode.
Figure 9:
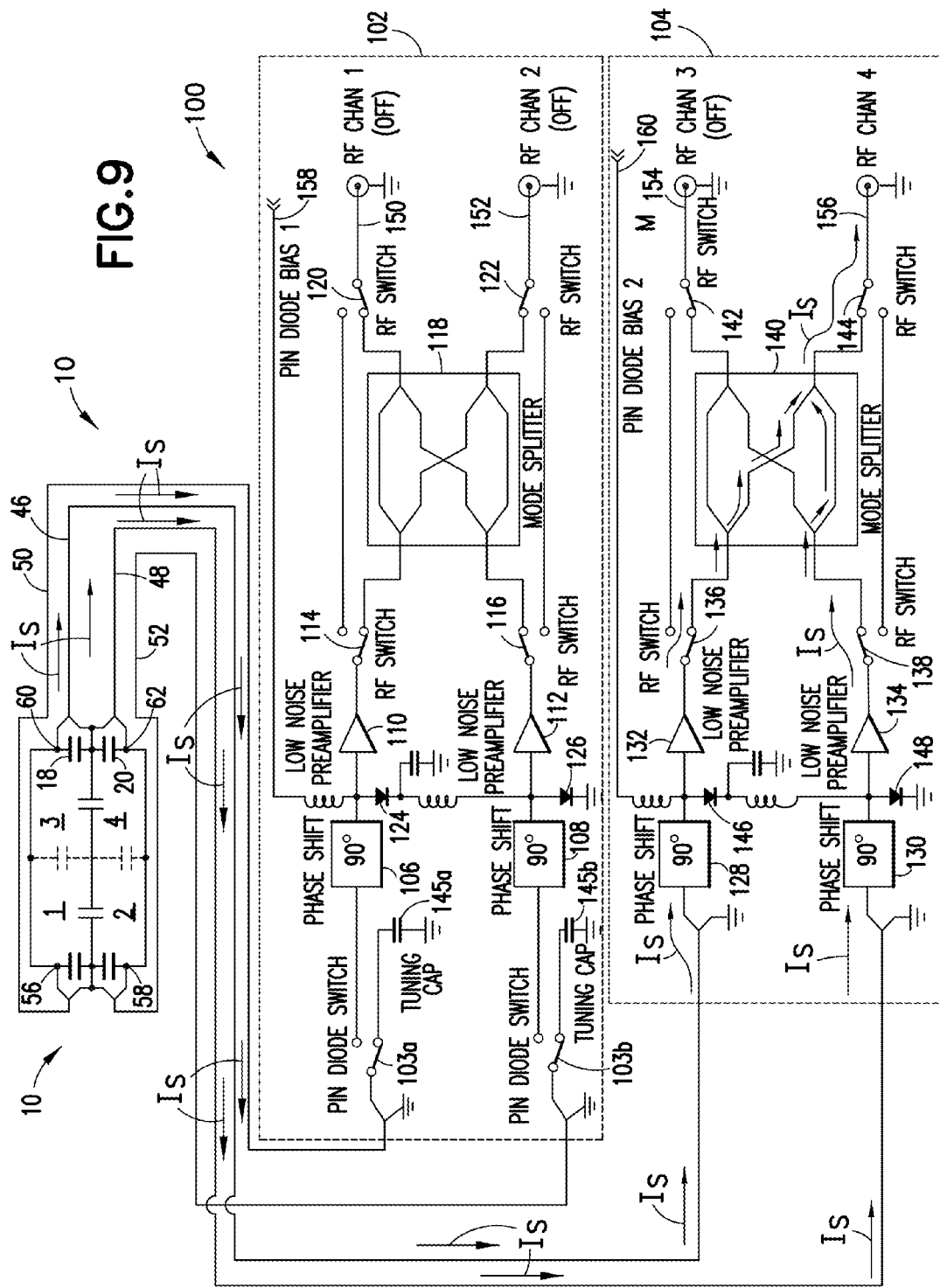
FIG. 9 is a block diagram of the interface device of FIG. 4 illustrating the manner in which the interface device operates when in Whole Saddle mode.
Figure 10A:
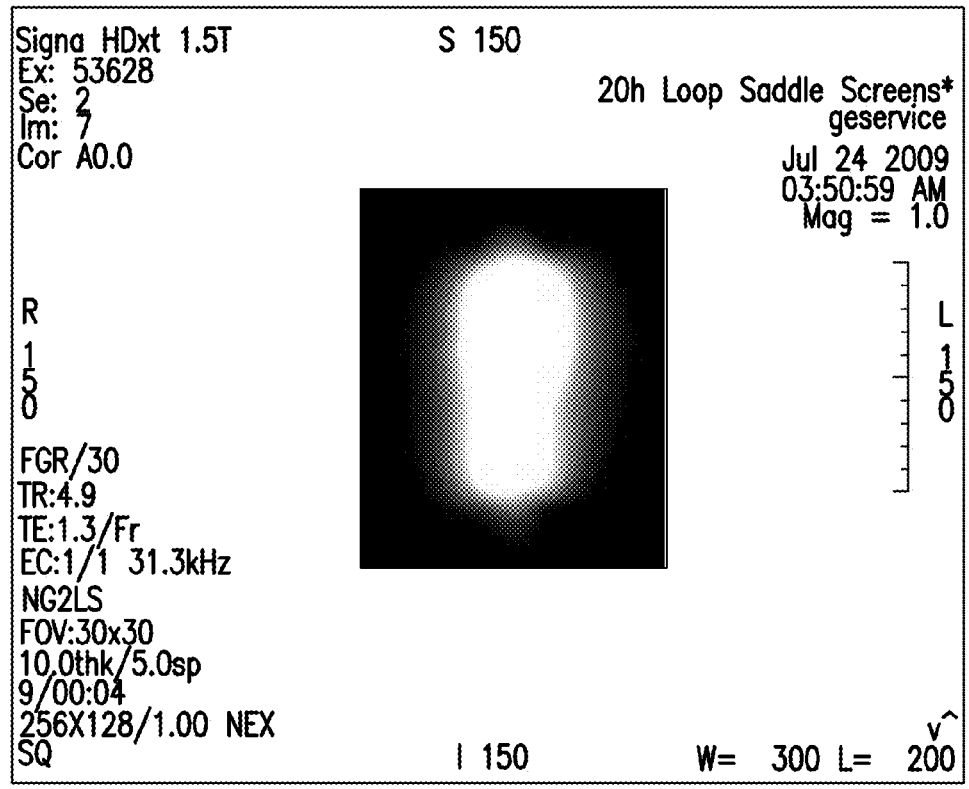
FIG. 10A is an exemplary image produced by an MR system when the coil of FIG. 3 and the interface device of FIG. 4 are operating in Whole Saddle mode and FIG. 10B is a schematic diagram of the coil of FIG. 3 illustrating the orientation of the coil to produce the image in FIG. 10A.
Figure 10B:
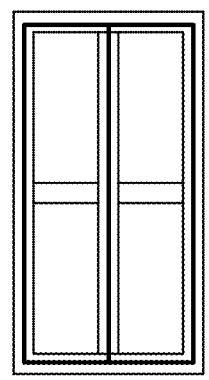

With reference to FIGS. 8-10, the operation of coil 10 and interface device 100 when in Whole Saddle mode will now be described. As shown in FIG. 8, during the receive cycle, beyond acting as an open circuit for outer loop 12 to enable detection of the vertical components of the MR signal, first center conductor 14 also operates with outer loop 12 to emulate a butterfly-type or saddle-type coil for detecting MR signals oriented parallel to the plane of coil 10. The tuning scheme of the present invention allows for a simple loop current path for outer loop 12 but also alternative current paths, involving counter-rotating currents, for the outer loop 12, the first center conductor 14 and the second center conductor 16 in various combinations. One of these combinations is the Whole Saddle mode as shown in FIG. 8. Specifically, during the receive cycle and starting near junction node 26, the current induced by the horizontally oriented MR signals flows across second drive capacitor 20 up to the far end of outer loop 12 and into and down first center conductor 14. As the current flows past second center conductor 16, a first leakage current flows through second center conductor 16. The main current then crosses the midpoint of the saddle structure and flows across first drive capacitor 18 up to the far end of outer loop 12 and into and down first center conductor 14 to start the cycle anew as long as coil 10 is in position to detect MR signals during the receive cycle of operation. As the current flows past second center conductor 16, a second leakage current flows through second center conductor 16. The second leakage current in the second center conductor 16 is equal to and opposite the first leakage current in the second center conductor 16, thereby canceling each other out. Accordingly, the second center conductor 16 is shown in phantom in FIGS. 8 and 9 because it is acting as an open circuit due to the canceling current flow. The flow of current through the coil in Whole Saddle mode is illustrated by arrows $I_S$ in FIG. 8.

The first center conductor 14 and outer loop 12 of FIG. 8 have, therefore, also been tuned to detect MR signals whose field lines are oriented horizontal to the plane of coil 10. This is because they have been tuned to emulate the saddle-type coil in whose identically-shaped subloops, the induced current is the same magnitude but flows in counter-rotating directions. Although not physically formed by twisting a conductive loop in the middle to form two subloops about a midpoint as is the case with prior art saddle coils. The coil structure of the present invention nevertheless electrically emulates the operation of a saddle coil in addition to a simple loop as described above in connection with outer loop 12.

Unlike for the voltage signals indicative of the vertically oriented MR signals, the tuning scheme does not impose a phase shift upon the resulting voltage signals attributable to the horizontally oriented MR signals detected by the saddle structure. Specifically, relative to the virtual ground at junction node 26, the phase of the "horizontal" voltage signals detectable across first drive capacitor 18 at the third port 60 is the same as (i.e., 0 degrees relative to) the phase of the "horizontal" voltage signals detectable across second drive capacitor 20 at the fourth port 62. The significance of this zero degree phase differential becomes apparent in connection with the operation of interface device 100 discussed below.

Having completed discussion of manner in which current flows through coil 10 during a receive cycle when in Whole Saddle mode, a description of the operation of interface device 100 during the receive cycle of the MR system when in Whole Saddle mode will now be described with specific reference to FIG. 9. Coil 10 outputs voltage signals representative of MR signals of both horizontal and vertical orientation.

With continued reference to FIG. 9, the manner in which interface device 100 processes the voltage signals received from output lines 42 and 44 is now described. The combination of configuration files loaded into the host scanner along with switching devices 114, 116, 120, 122, 136, 138, 142, and 144 are provided to allow the host scanner to "turn off" or ignore the output of any one of a first channel 150, a second channel 152, a third channel 154, or a fourth channel 156. When operating in Whole Saddle mode, the host scanner is configured to ignore the output of the first channel 150, the second channel 152 and the third channel 154. The phase shifting network 128 shifts the 0 degree horizontal voltage signals and the 0 degree vertical voltage signals received from first drive capacitor 18 via output cable 46 to 90 degree horizontal voltage signals and 90 degree vertical voltage signals, respectively. Similarly, phase shifting network 130 shifts the 0 degree horizontal voltage signals and the 180 degree vertical voltage signals received from second drive capacitor 20 via output cable 48 to 90 degree horizontal voltage signals and −90 degree vertical voltage signals, respectively. Preamplifier networks 132 and 134 each amplify the voltage signals they receive and pass the resulting amplified versions to first and second switching devices 136 and 138, respectively. The positions of first and second switching devices 136 and 138 are controlled by configuration files in the scanner. First and second switching devices 136 and 138 can be positioned to either send the signals to the mode splitter 140 or to bypass the mode splitter 140. In Whole Saddle mode, both signals are fed to the mode splitter 140 where the signals are appropriately combined and output to the host scanner via fourth channel 156. As discussed above, the output of the first channel 150, the second channel 152 and the third channel 154 are ignored by the host scanner. The flow of current through interface device 100 is shown by arrows $I_S$ in FIG. 9.

Accordingly, an image as shown in FIG. 10A is produced by the host scanner when in Whole Saddle mode based on the signal received from interface device 100.

Whole Loop and Whole Saddle Mode

Figure 11:
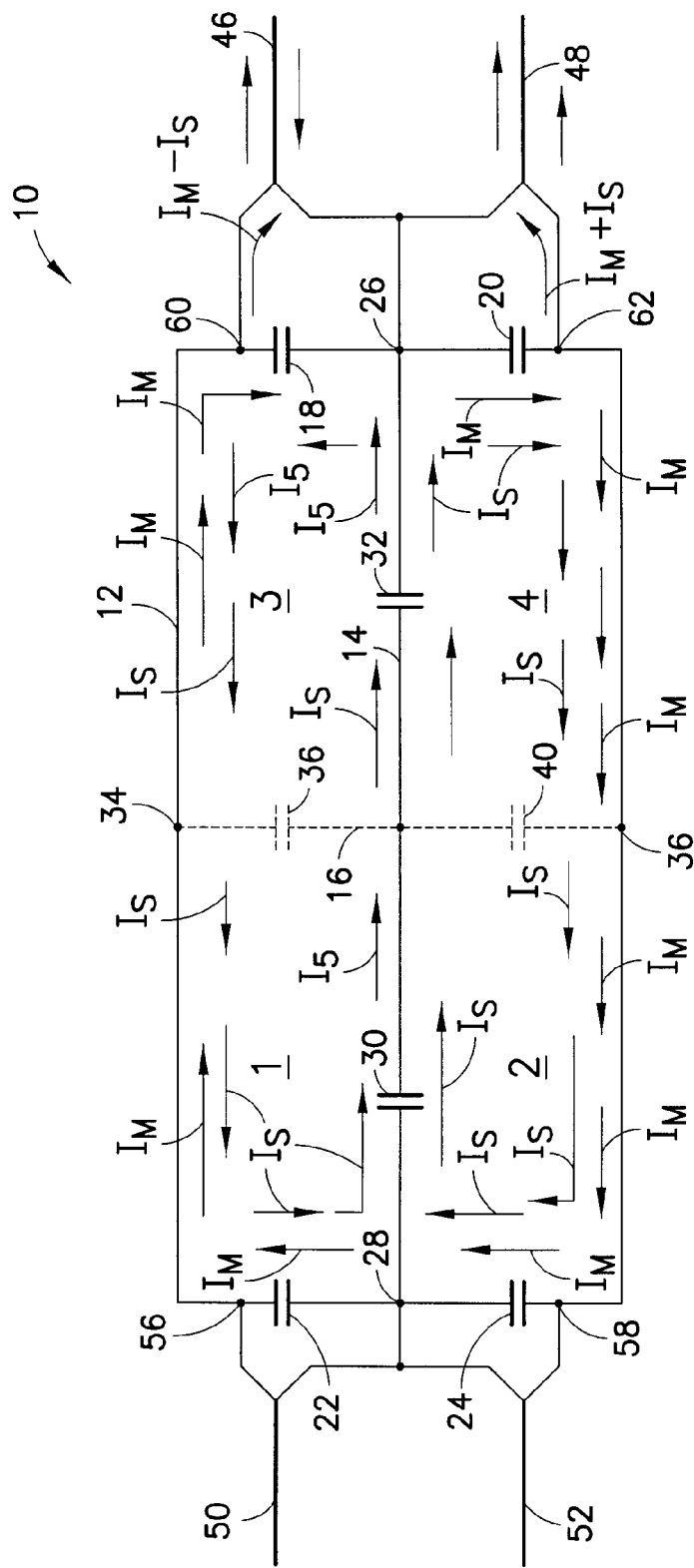
FIG. 11 is a schematic diagram of the coil of FIG. 3 illustrating the manner in which current is induced therein when in Whole Loop and Whole Saddle mode.
Figure 12:
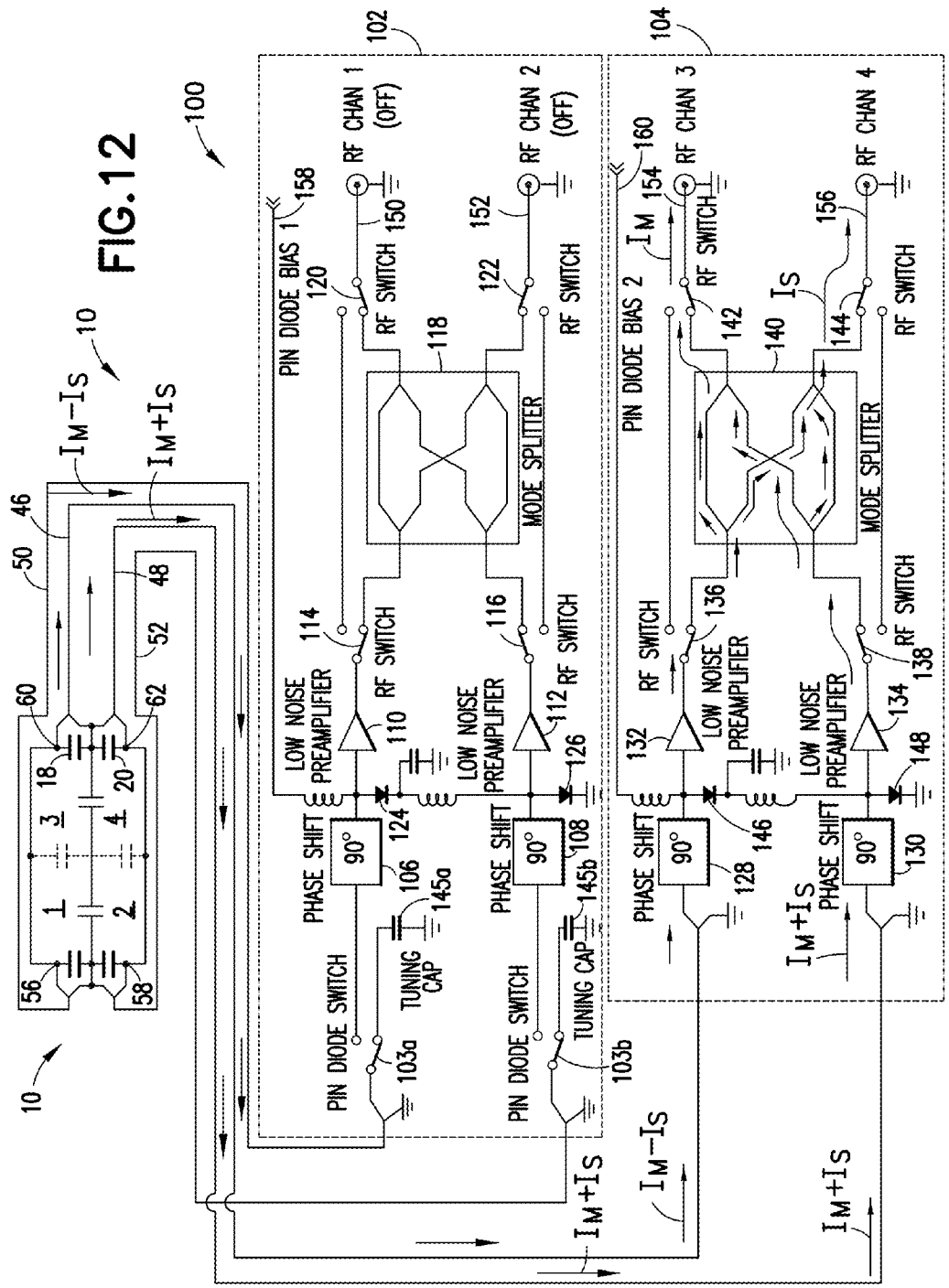
FIG. 12 is a block diagram of the interface device of FIG. 4 illustrating the manner in which the interface device operates when in Whole Loop and Whole Saddle mode.
Figure 13A:
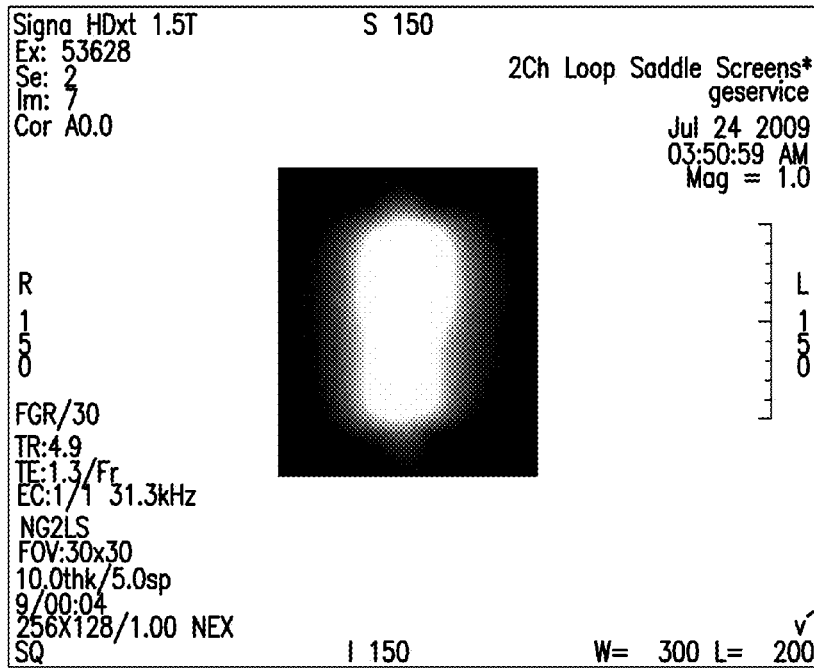
FIGS. 13A-C are exemplary images produced by an MR system when the coil of FIG. 3 and the interface device of FIG. 4 are operating in Whole Loop and Whole Saddle mode and FIG. 13D is a schematic diagram of the coil of FIG. 3 illustrating the orientation of the coil to produce the images in FIGS. 13A-C.
Figure 13B:
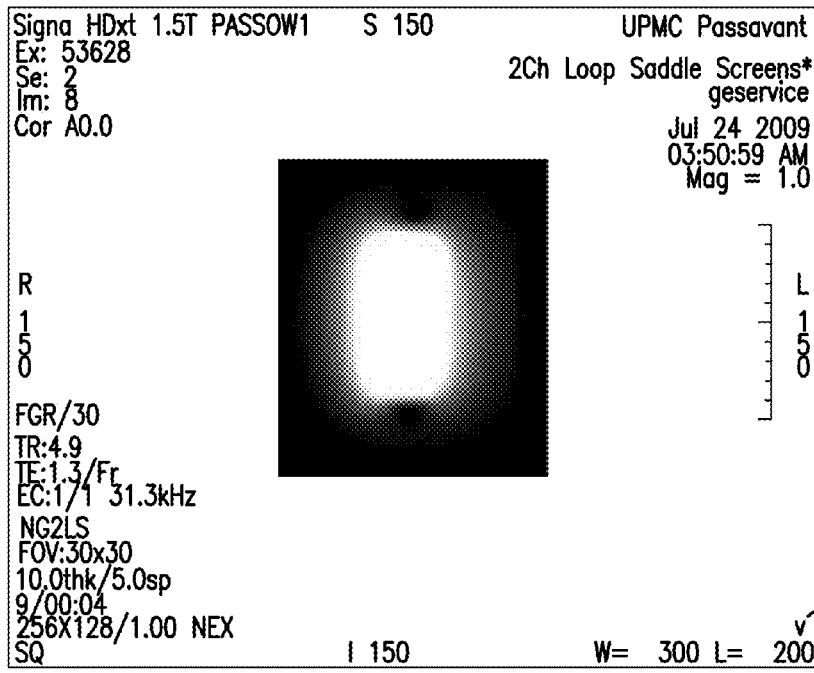
Figure 13C:
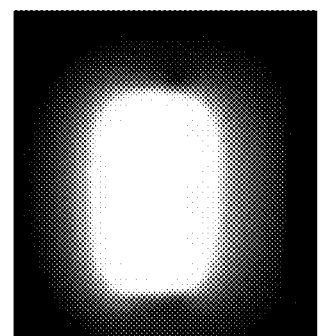
Figure 13D:
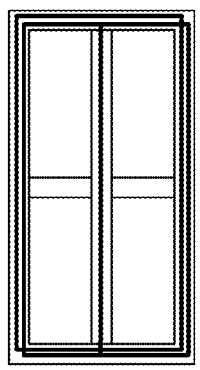

With reference to FIGS. 11-13, the operation of coil 10 and interface device 100 when in Whole Loop and Whole Saddle mode, will now be described. As shown in FIG. 11, during the receive cycle, when operating in Whole Loop and Whole Saddle mode, coil 10 operates in the same manner as described hereinabove for both the Whole Loop and Whole Saddle modes. The flow of current through the coil is illustrated by arrows $I_M$ and $I_S$ in FIG. 12. However, interface device 100 functions in a slightly different manner. Instead of utilizing the configuration files to ignore the output of the fourth channel 156 as in the Whole Loop mode or to ignore the output of the third channel 154 as in the Whole Saddle Mode, only the outputs of the first and second channels 150, 152 are ignored. Accordingly, a 2-channel signal in FIG. 12 is provided to the host scanner to provide as image 300, as shown in FIG. 13C. This image is a combination of the image 302 produced in Whole Loop mode and shown in FIG. 13B and the image 304 produced in Whole Saddle mode and shown in FIG. 13A.

Focus UP mode

Figure 14:
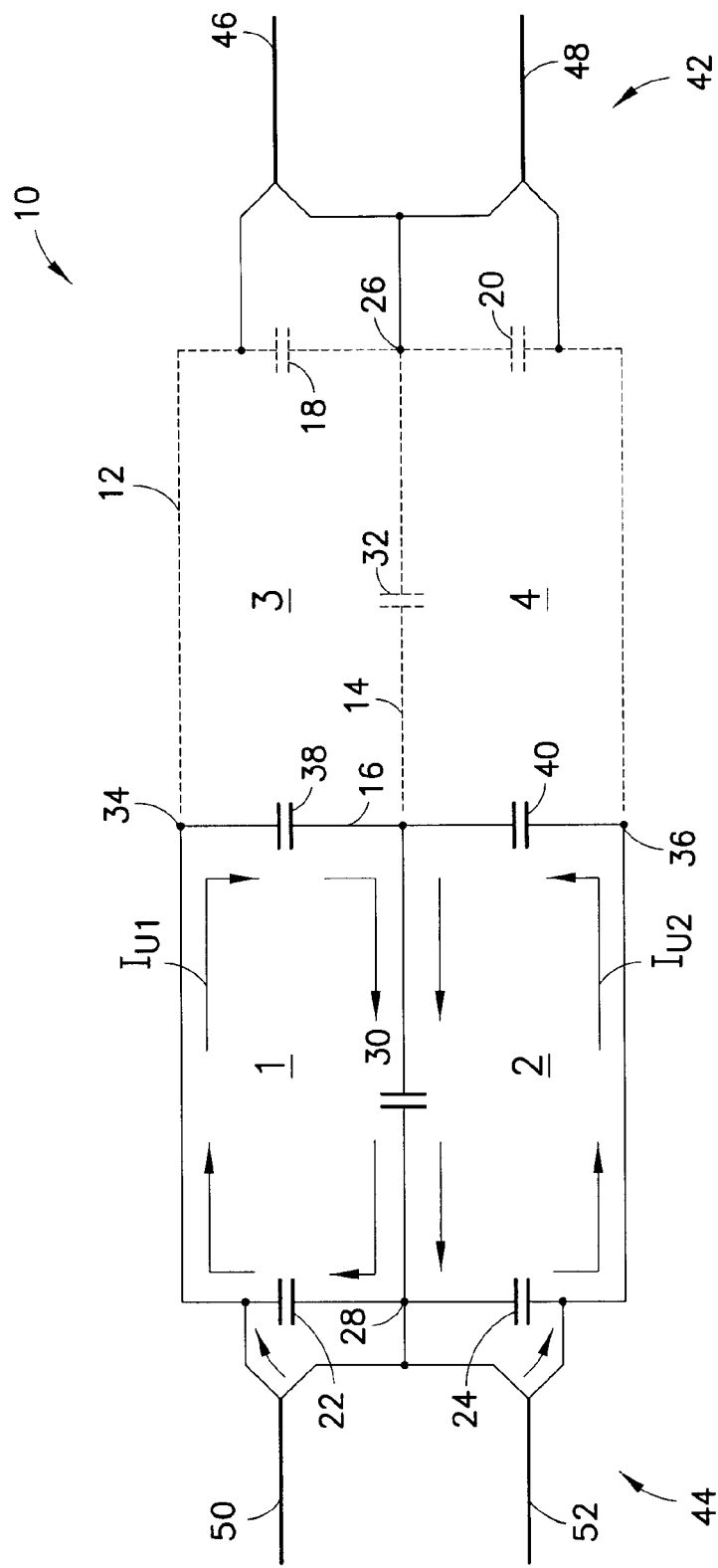
FIG. 14 is a schematic diagram of the coil of FIG. 3 illustrating the manner in which current is induced therein when in Focus UP mode.
Figure 15:
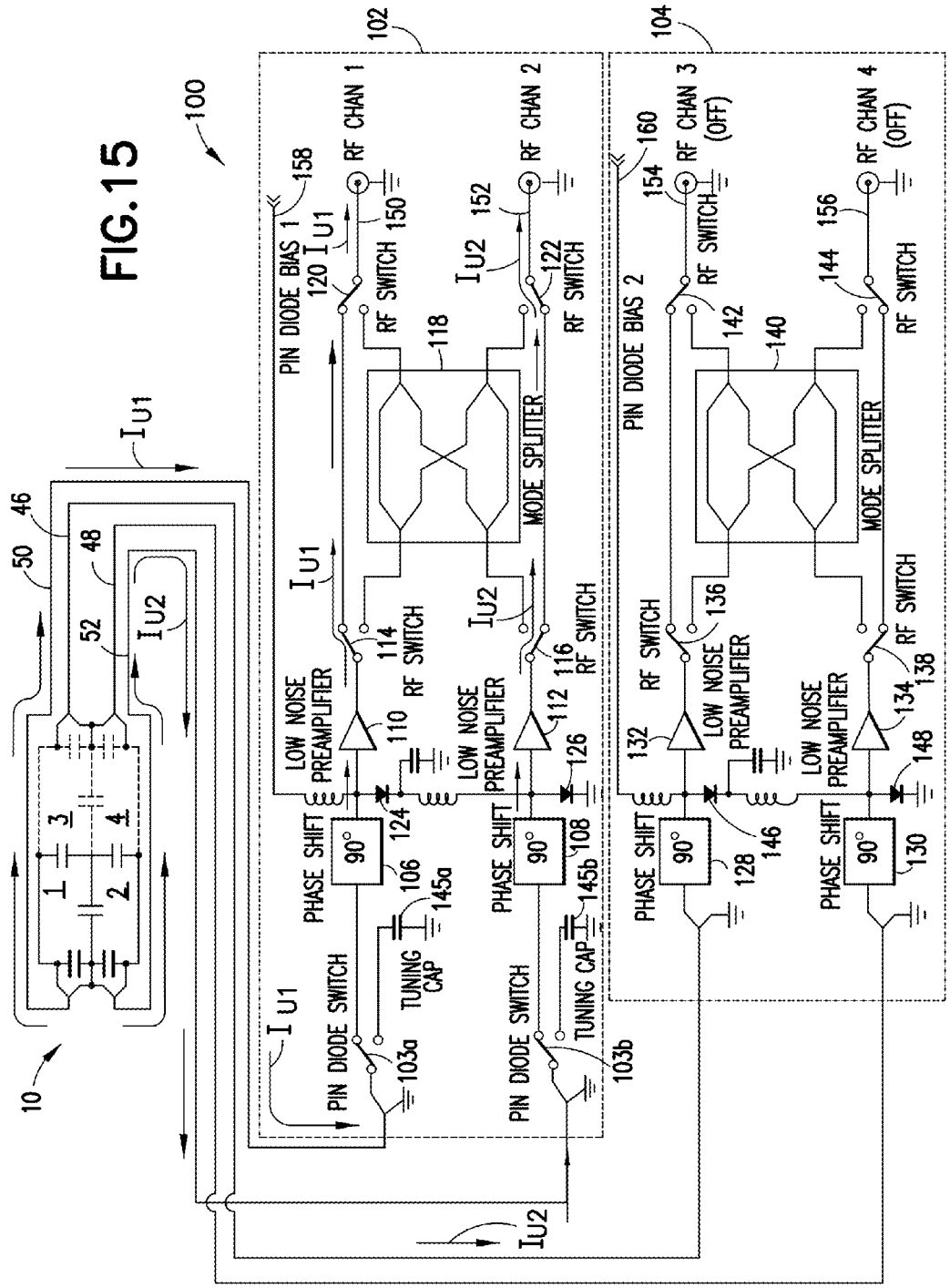
FIG. 15 is a block diagram of the interface device of FIG. 4 illustrating the manner in which the interface device operates when in Focus UP mode.

With reference to FIGS. 14-16, the operation of coil 10 and interface device 100 when in Focus UP mode will now be described. During transmit mode, PIN diodes 146 and 148 are turned on by a signal from a PIN diode bias 160. These PIN diodes 146 and 148 provide an RF short circuit to ground, which is reflected through phase-shift networks 128 and 130 as an open circuit at each coaxial connector 46 and 48. Accordingly, elements 3 and 4 of coil 10 are isolated and shown in phantom in FIGS. 14 and 15.

As shown in FIG. 14, during the receive cycle, current will only be seen as flowing through elements 1 and 2 of coil 10 due to the PIN diodes 146 and 148 acting as an RF "open" to help in isolating elements 3 and 4. Accordingly, current flows in element 1 as shown by arrow $I_{U1}$ and in element 2 as shown by arrow $I_{U2}$, as shown in FIG. 14.

With reference to FIG. 15, the manner in which interface device 100 processes the voltage signals received from output lines 50 and 52 is now described. The combination of configuration files loaded into the host scanner along with switching devices 114, 116, 120, 122, 136, 138, 142, and 144 are provided to allow the host scanner to "turn off" or ignore the output of any one of a first channel 150, a second channel 152, a third channel 154, or a fourth channel 156. When operating in Focus UP mode, the host scanner is configured to ignore the output of the third channel 154 and the fourth channel 156.

The signal from third drive capacitor 22 is sent through phase shifting network 106, preamplifier network 110, which amplifies the voltage signal, passes the resulting amplified versions to first switching network 114. First switching device 114 is set by configuration files of the host scanner to send the signal directly to third switching device 120 and to bypass the mode splitter 118. The signal is then output to the host scanner via the first channel 150.

The signal from fourth drive capacitor 24 is sent through phase shifting network 108, preamplifier network 112, which amplifies the voltage signal passes the resulting amplified versions to second switching device 116. Second switching device 116 is set by configuration files of the host scanner to send the signal directly to fourth switching device 122 and to bypass the mode splitter 118. The signal is then output to the host scanner via the second channel 152.

Figure 16A:
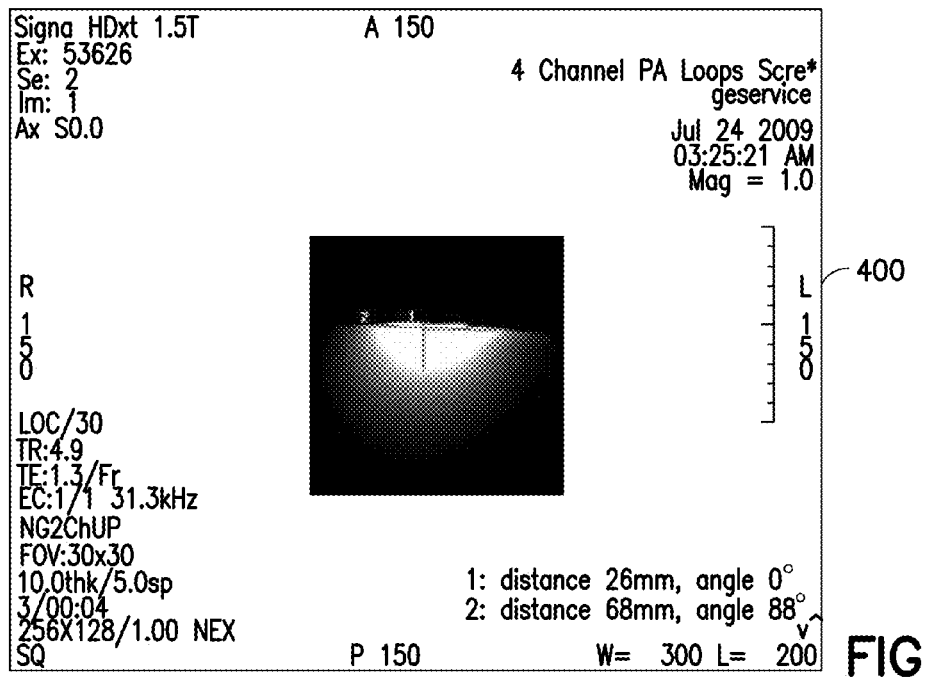
FIGS. 16A-C are exemplary images produced by an MR system when the coil of FIG. 3 and the interface device of FIG. 4 are operating in Focus UP mode and FIG. 16D is a schematic diagram of the coil of FIG. 3 illustrating the orientation of the coil to produce the images in FIGS. 16A-C.
Figure 16B:
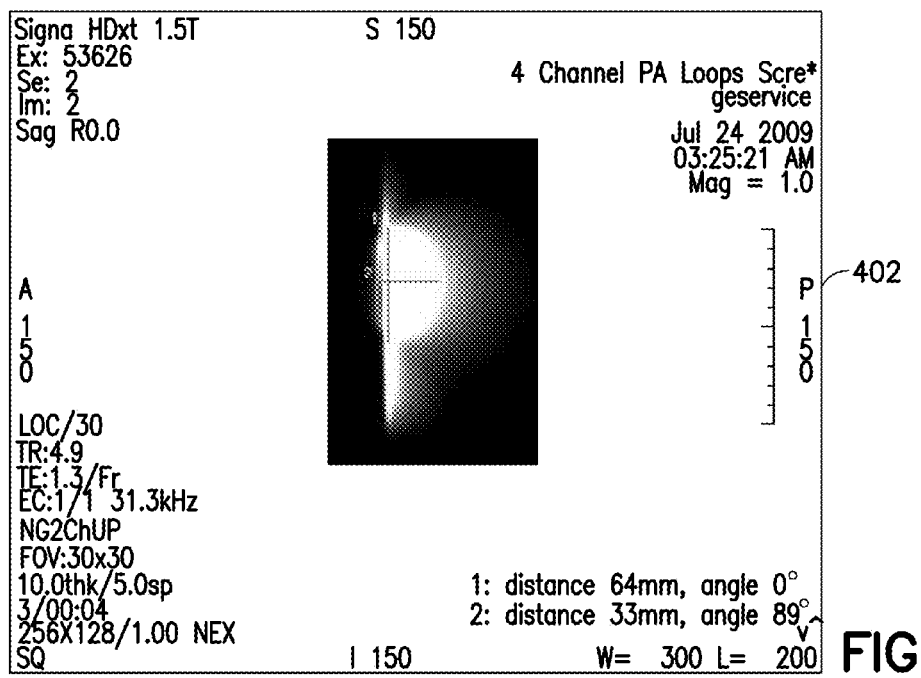
Figure 16C:
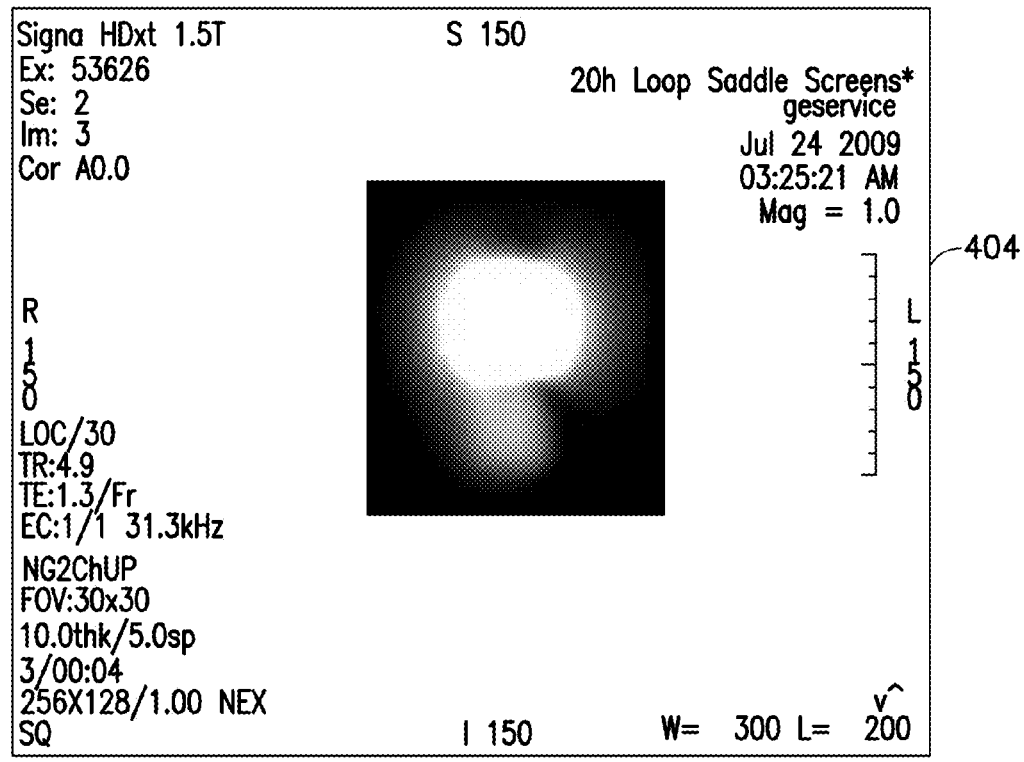
Figure 16D:
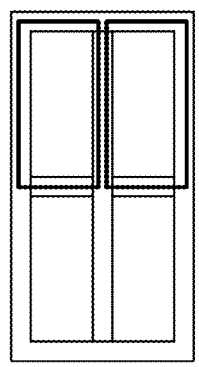

The flow of current through interface device 100 when in Focus UP mode is shown by arrows $I_{U1}$ and $I_{U2}$ in FIG. 15. A 2-channel signal is provided to the host scanner to provide image 400 (axial view), as shown in FIG. 16A, image 402 (sagittal view), as shown in FIG. 16B and image 404 (coronal view), as shown in FIG. 16C.

Focus DOWN Mode

Figure 17:
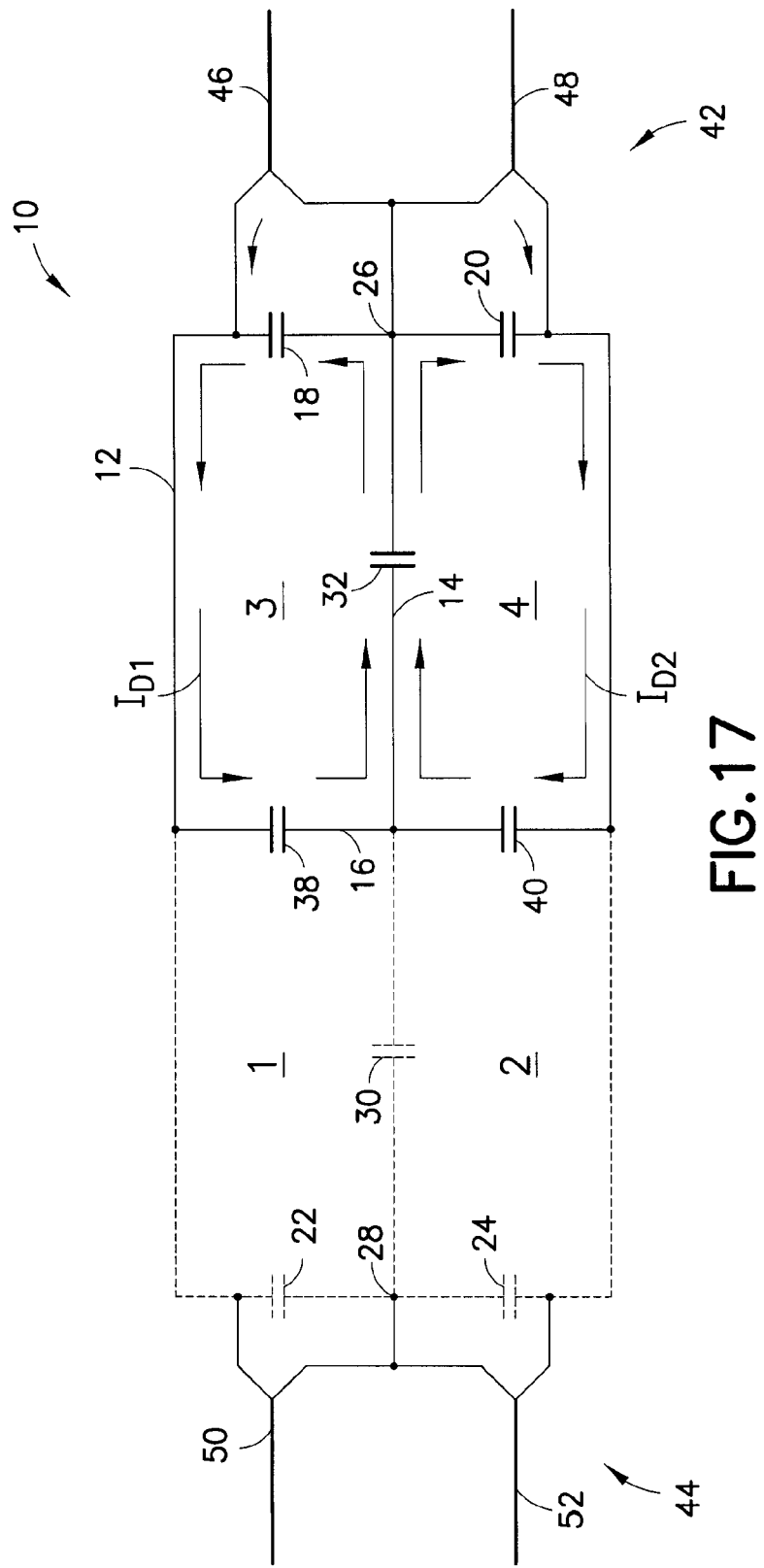
FIG. 17 is a schematic diagram of the coil of FIG. 3 illustrating the manner in which current is induced therein when in Focus DOWN mode.
Figure 18:
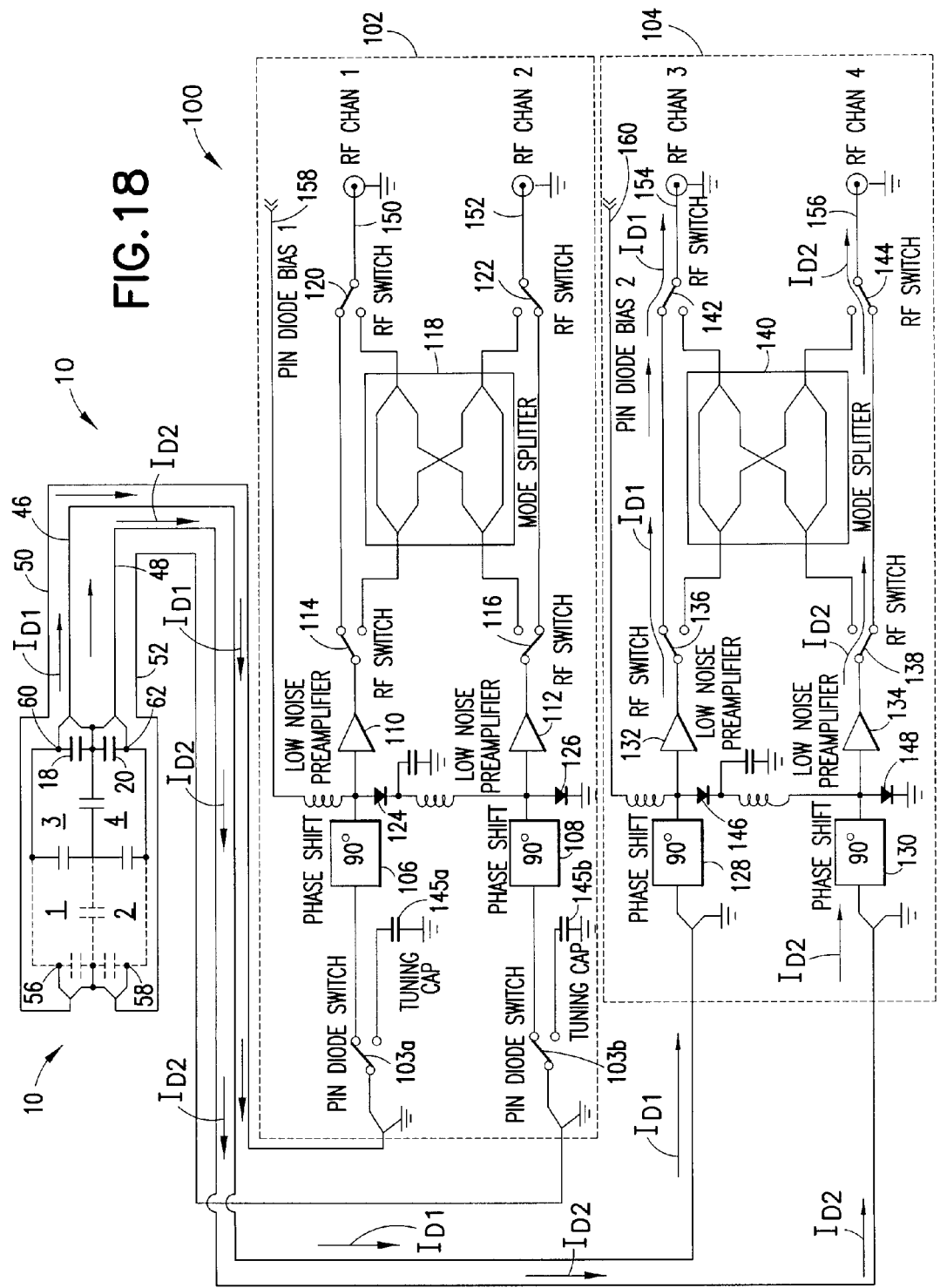
FIG. 18 is a block diagram of the interface device of FIG. 4 illustrating the manner in which the interface device operates when in Focus DOWN mode.

With reference to FIGS. 17-19, the operation of coil 10 and interface device 100, when in Focus DOWN mode, will now be described. During transmit mode, PIN diodes 124 and 126 are turned on by a signal from a PIN diode bias 158. These PIN diodes 124 and 126 provide an RF short circuit to ground, which is reflected through phase-shift networks 106 and 108 as an open circuit at each coaxial connector 50 and 52. Accordingly, elements 1 and 2 of coil 10 are isolated and shown in phantom in FIGS. 17 and 18.

As shown in FIG. 17, during the receive cycle, current will only be seen as flowing through elements 3 and 4 of coil 10 due to the PIN diodes 124 and 126 acting as an RF "open" to help in isolating elements 1 and 2. Accordingly, current flows in element 3, as shown by arrow $I_{D1}$, and in element 4, as shown by arrow $I_{D2}$, as shown in FIG. 17.

With reference to FIG. 18, the manner in which interface device 100 processes the voltage signals received from output lines 46 and 48 is now described. The combination of configuration files loaded into the host scanner along with switching devices 114, 116, 120, 122, 136, 138, 142, and 144 are provided to allow the host scanner to "turn off" or ignore the output of any one of a first channel 150, a second channel 152, a third channel 154, or a fourth channel 156. When operating in Focus DOWN mode, the host scanner is configured to ignore the output of the first channel 150 and the second channel 152.

The signal from first drive capacitor 18 is sent through phase shifting network 128, preamplifier network 132, which amplifies the voltage signal, passes the resulting amplified versions to first switching device 136. First switching device 136 is set by configuration files of the host scanner to send the signal directly to third switching device 142 and to bypass the mode splitter 140. The signal is then output to the host scanner via the third channel 154.

The signal from second drive capacitor 20 is sent through phase shifting network 130, preamplifier network 134, which amplifies the voltage signal, passes the resulting amplified versions to second switching device 138. Second switching device 138 is set by configuration files of the host scanner to send the signal directly to fourth switching device 144 and to bypass the mode splitter 140. The signal is then output to the host scanner via the fourth channel 156.

Figure 19A:
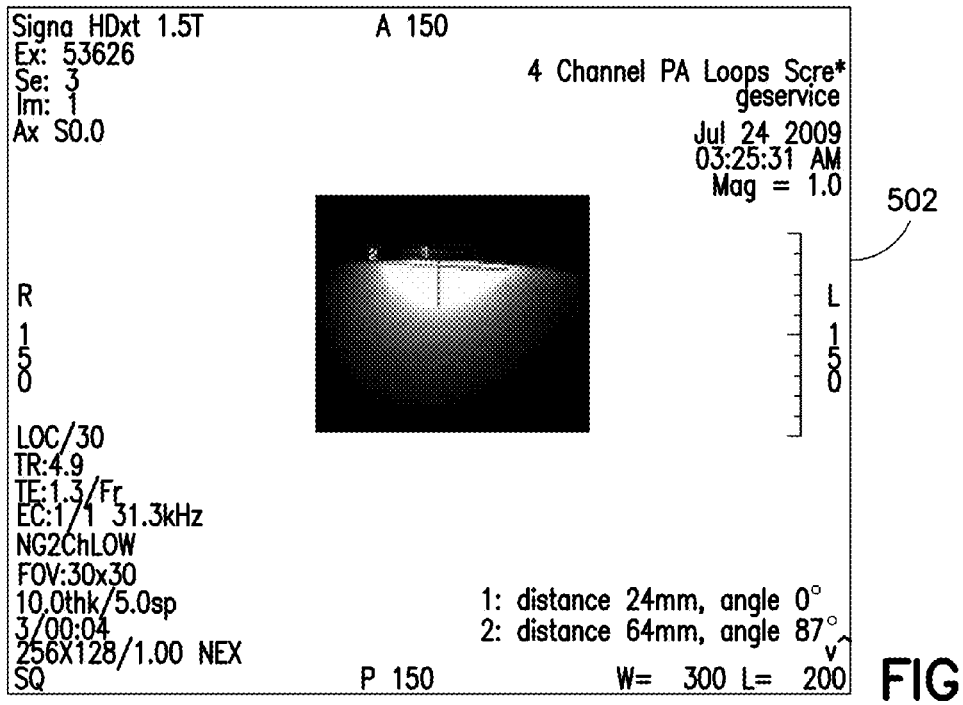
FIGS. 19A-C are exemplary images produced by an MR system when the coil of FIG. 3 and the interface device of FIG. 4 are operating in Focus DOWN mode and FIG. 19D is a schematic diagram of the coil of FIG. 3 illustrating the orientation of the coil to produce the images in FIGS. 19A-C.
Figure 19B:
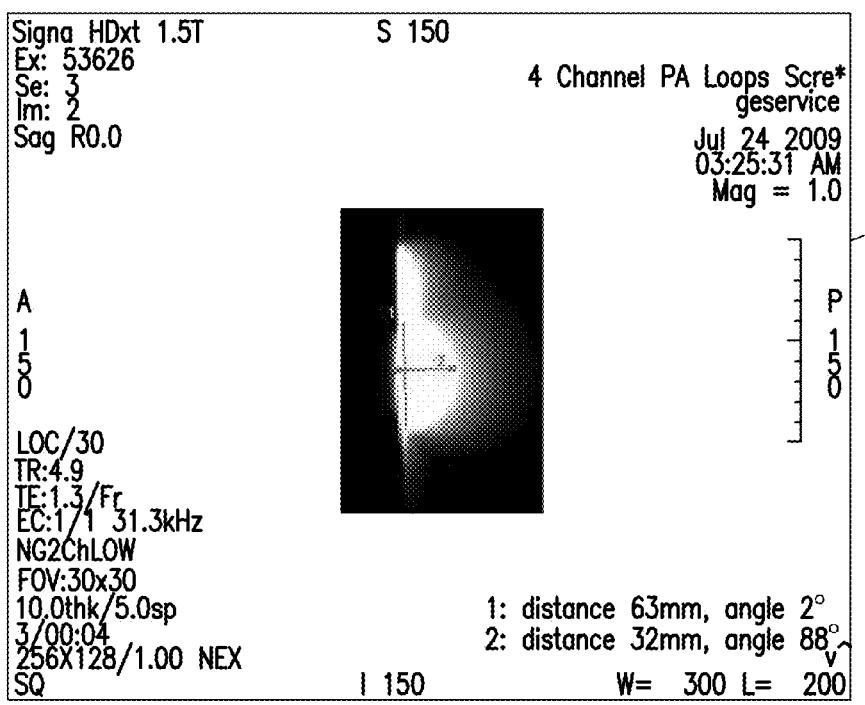
Figure 19C:
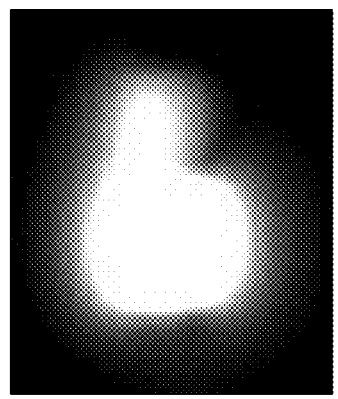
Figure 19D:
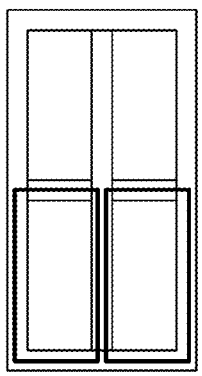

The flow of current through interface device 100 when in Focus DOWN mode is shown by arrows $I_{D1}$ and $I_{D2}$ in FIG. 18. A 2-channel signal is provided to the host scanner to provide image 500 (sagittal view), as shown in FIG. 19B, image 502 (axial view), as shown in FIG. 19A, and image 504 (coronal view), as shown in FIG. 19C.

Focus LEFT Mode

Figure 20:
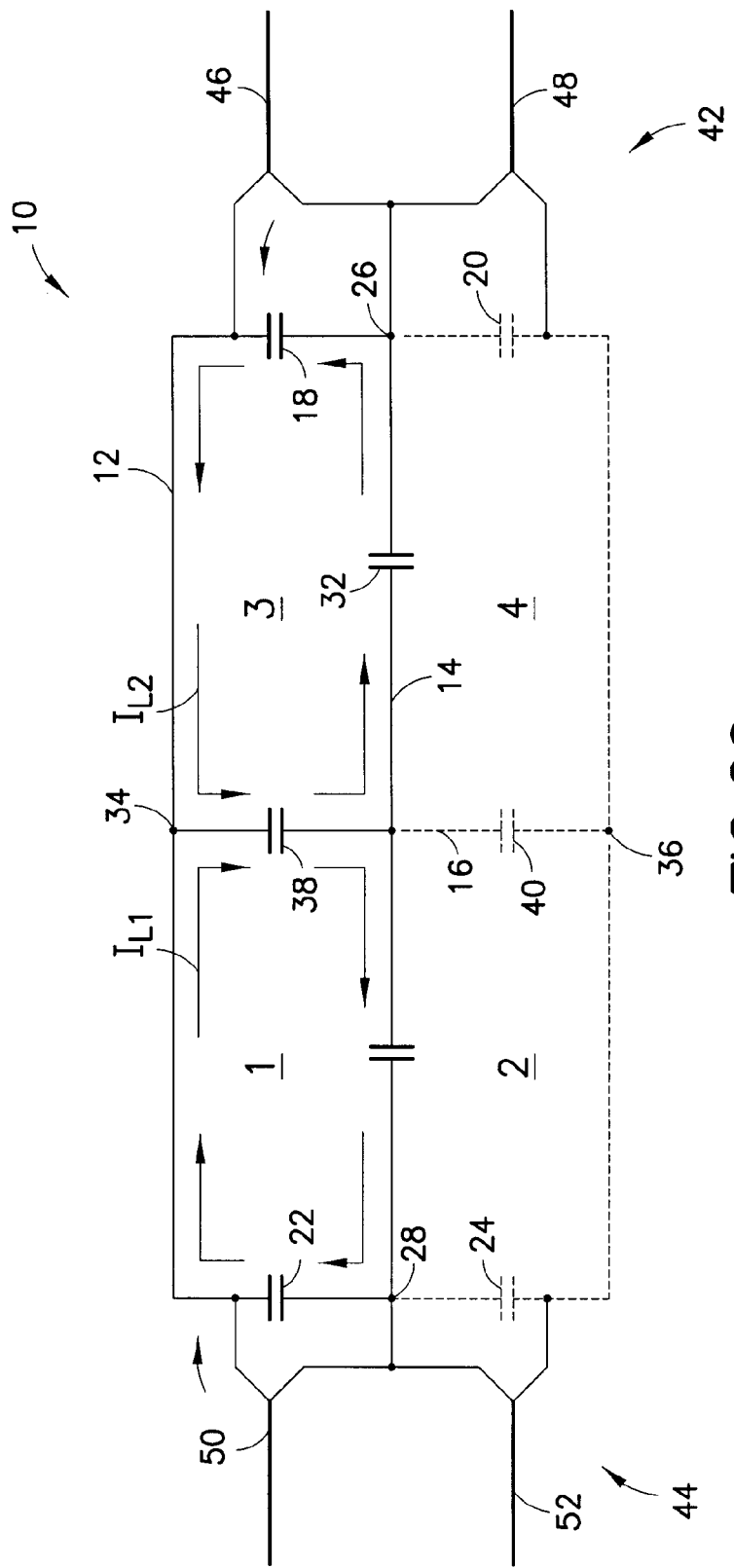
FIG. 20 is a schematic diagram of the coil of FIG. 3 illustrating the manner in which current is induced therein when in Focus LEFT mode.

With reference to FIGS. 20-22, the operation of coil 10 and interface device 100 when in Focus LEFT mode will now be described. During transmit mode, PIN diodes 126 and 148 are turned on by a signal from a PIN diode bias 158 and PIN diode bias 160. These PIN diodes 126 and 148 provide an RF short circuit to ground, which is reflected through phase-shift networks 108 and 130 as an open circuit at each coaxial connector 52 and 48. Accordingly, elements 2 and 4 of coil 10 are isolated and shown in phantom in FIGS. 21 and 22

As shown in FIG. 20, during the receive cycle, current will only be seen as flowing through elements 1 and 3 of coil 10 due to the PIN diodes 126 and 148 acting as an RF "open" to help in isolating elements 2 and 4. Accordingly, current flows in element 1, as shown by arrow $I_{L1}$, and in element 3, as shown by arrow $I_{L2}$, as shown in FIG. 20.

With reference to FIG. 21, the manner in which interface device 100 processes the voltage signals received from output lines 50 and 46 is now described. The combination of configuration files loaded into the host scanner along with switching devices 114, 116, 120, 122, 136, 138, 142, and 144 are provided to allow the host scanner to "turn off" or ignore the output of any one of a first channel 150, a second channel 152, a third channel 154, or a fourth channel 156. When operating in Focus LEFT mode, the host scanner is configured to ignore the output of the second channel 152 and the fourth channel 156.

The signal from third drive capacitor 22 is sent through phase shifting network 106, preamplifier network 110, which amplifies the voltage signal and passes the resulting amplified version to first switching device 114. First switching device 114 is set by configuration files of the host scanner to send the signal directly to third switching device 120 and to bypass the mode splitter 118. The signal is then output to the host scanner via the first channel 150.

The signal from first drive capacitor 18 is sent through phase shifting network 128, preamplifier network 132, which amplifies the voltage signal and passes the resulting amplified version to first switching device 136. First switching device 136 is set by configuration files of the host scanner to send the signal directly to the third switching device 142 and to bypass the mode splitter 140. The signal is then output to the host scanner via the third channel 154.

Figure 22A:
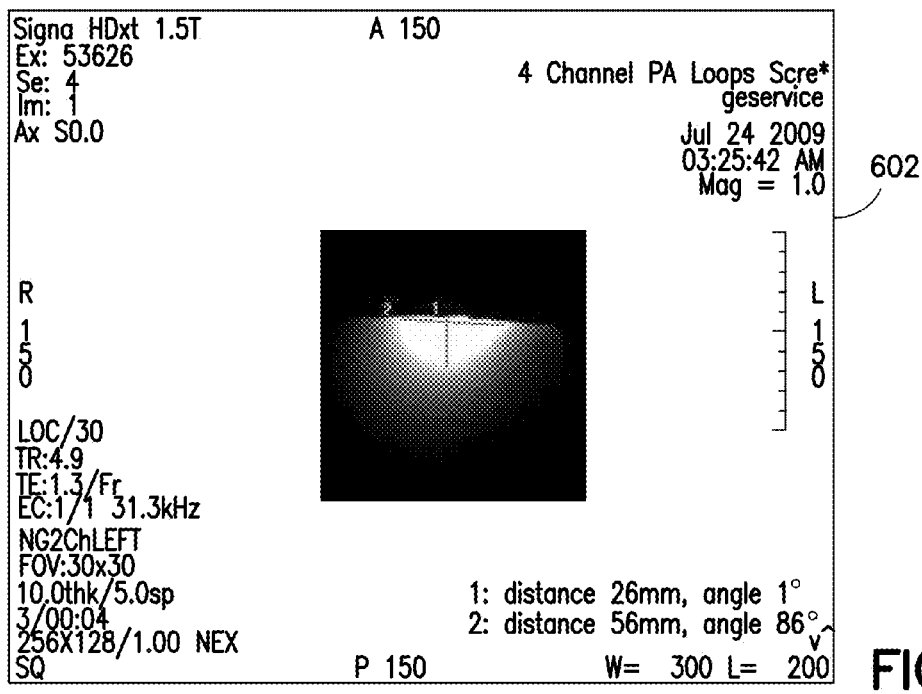
FIGS. 22A-C are exemplary images produced by an MR system when the coil of FIG. 3 and the interface device of FIG. 4 are operating in Focus LEFT mode and FIG. 22D is a schematic diagram of the coil of FIG. 3 illustrating the orientation of the coil to produce the images in FIGS. 22A-C.
Figure 22B:
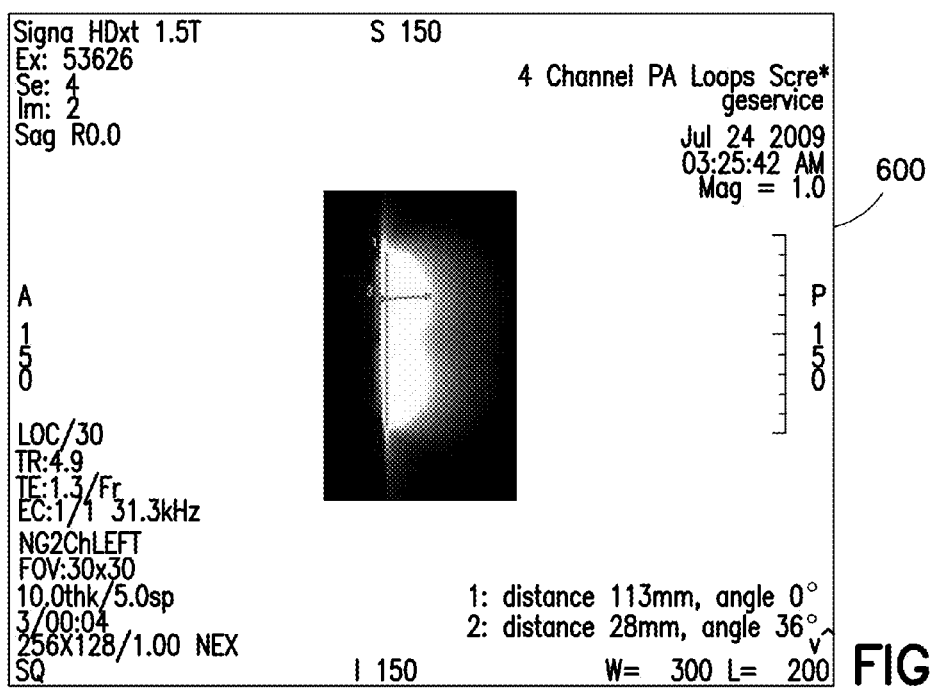
Figure 22C:
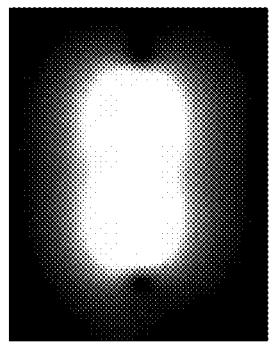
Figure 22D:
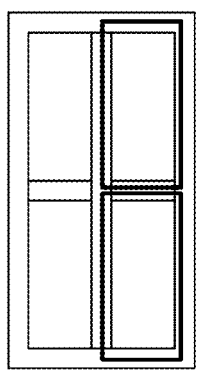

The flow of current through interface device 100 when in Focus LEFT mode is shown by arrows $I_{L1}$ and $I_{L2}$ in FIG. 21. A 2-channel signal is provided to the host scanner to provide image 600 (sagittal view) as shown in FIG. 22B, image 602 (axial view) as shown in FIG. 22A, and image 604 (coronal view) as shown in FIG. 22C.

Focus RIGHT Mode

Figure 23:
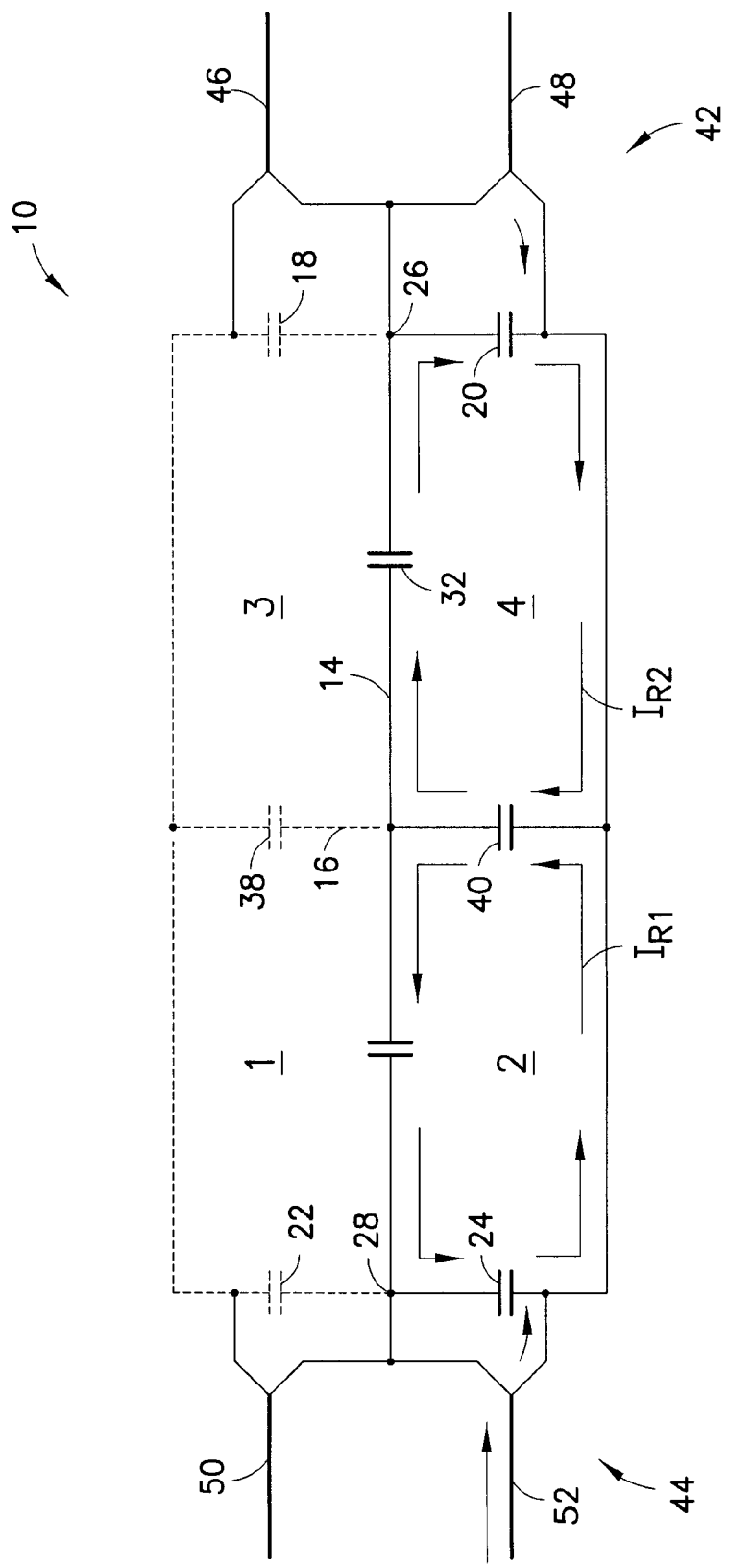
FIG. 23 is a schematic diagram of the coil of FIG. 3 illustrating the manner in which current is induced therein when in Focus RIGHT mode.
Figure 24:
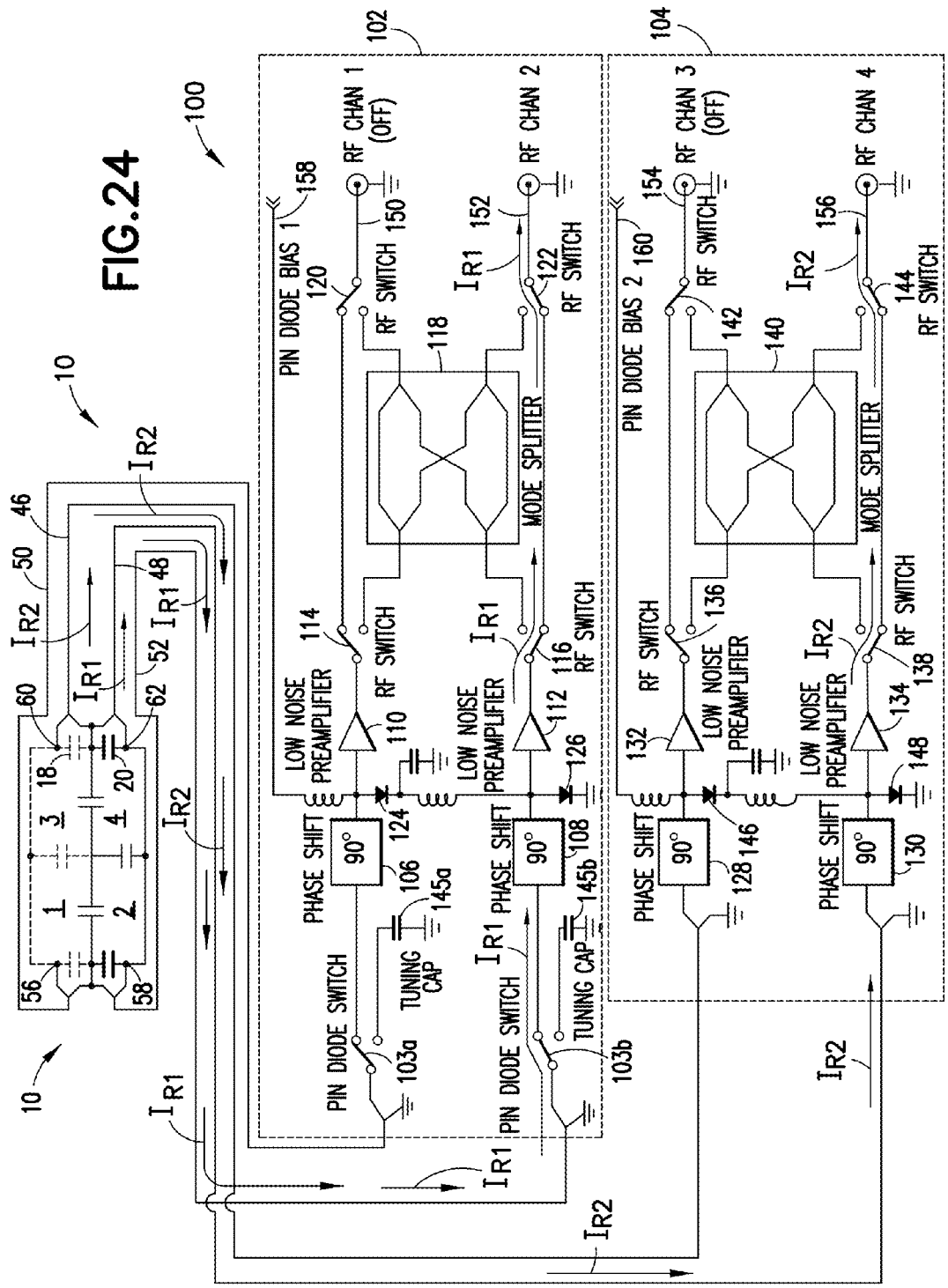
FIG. 24 is a block diagram of the interface device of FIG. 4 illustrating the manner in which the interface device operates when in Focus RIGHT mode.

With reference to FIGS. 23-25, the operation of coil 10 and interface device 100 when in Focus RIGHT mode will now be described. During transmit mode, PIN diodes 124 and 146 are turned on by a signal from a PIN diode bias 158 or a PIN diode bias 160. These PIN diodes 124 and 146 provide an RF short circuit to ground, which is reflected through phase-shift networks 106 and 128 as an open circuit at each coaxial connector 50 and 46. Accordingly, elements 1 and 3 of coil 10 are isolated and shown in phantom in FIGS. 23 and 24.

As shown in FIG. 23, during the receive cycle, current will only be seen as flowing through elements 2 and 4 of coil 10 due to the PIN diodes 124 and 146 acting as an RF "open" to help in isolating elements 1 and 3. Accordingly, current flows in element 2 as shown by arrow $I_{R1}$ and in element 4 as shown by arrow $I_{R2}$ as shown in FIG. 23.

With reference to FIG. 24, the manner in which interface device 100 processes the voltage signals received from output lines 48 and 52 is now described. The combination of configuration files loaded into the host scanner along with switching devices 114, 116, 120, 122, 136, 138, 142, and 144 are provided to allow the host scanner to "turn off" or ignore the output of any one of a first channel 150, a second channel 152, a third channel 154, or a fourth channel 156. When operating in Focus RIGHT mode, the host scanner is configured to ignore the output of the first channel 150 and the third channel 154.

The signal from fourth drive capacitor 24 is sent through phase shifting network 108, preamplifier network 112, which amplifies the voltage signal and passes the resulting amplified version to second switching device 116. Second switching device 116 is set by configuration files of the host scanner to send the signal directly to fourth switching device 122 and to bypass the mode splitter 118. The signal is then output to the host scanner via the second channel 152.

The signal from second drive capacitor 20 is sent through phase shifting network 130, preamplifier network 134, which amplifies the voltage signal and passes the resulting amplified version to second switching device 138. Second switching device 138 is set by configuration files of the host scanner to send the signal directly to fourth switching device 144 and to bypass the mode splitter 140. The signal is then output to the host scanner via the fourth channel 156.

Figure 25A:
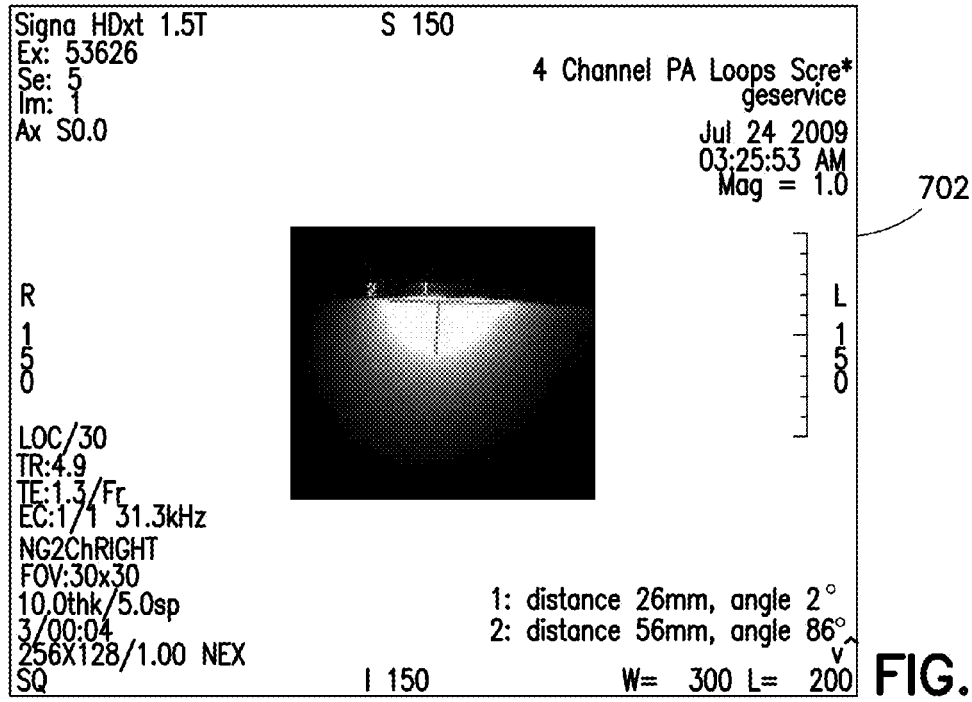
FIGS. 25A-C are exemplary images produced by an MR system when the coil of FIG. 3 and the interface device of FIG. 4 are operating in Focus RIGHT mode and FIG. 25D is a schematic diagram of the coil of FIG. 3 illustrating the orientation of the coil to produce the images in FIGS. 25A-C.
Figure 25B:
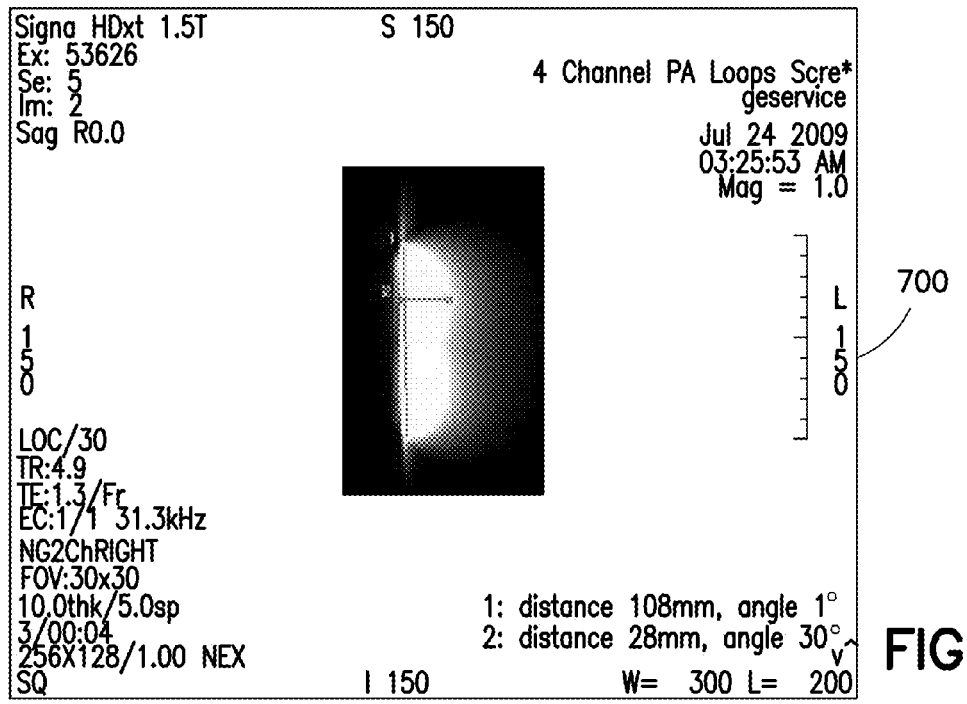
Figure 25C:
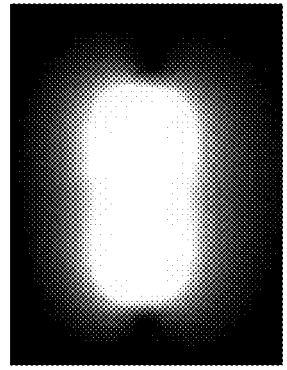
Figure 25D:
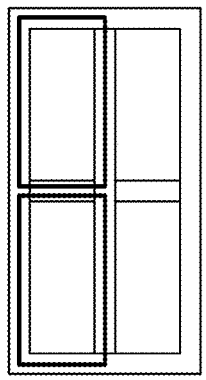

The flow of current through interface device 100 when in Focus RIGHT mode is shown by arrows $I_{R1}$ and $I_{R2}$ in FIG. 24. A 2-channel signal is provided to the host scanner to provide image 700 (sagittal view), as shown in FIG. 25B, image 702 (axial view) as shown in FIG. 25A, and image 704 (coronal view), as shown in FIG. 25C.

Focus ALL Mode

Figure 26:
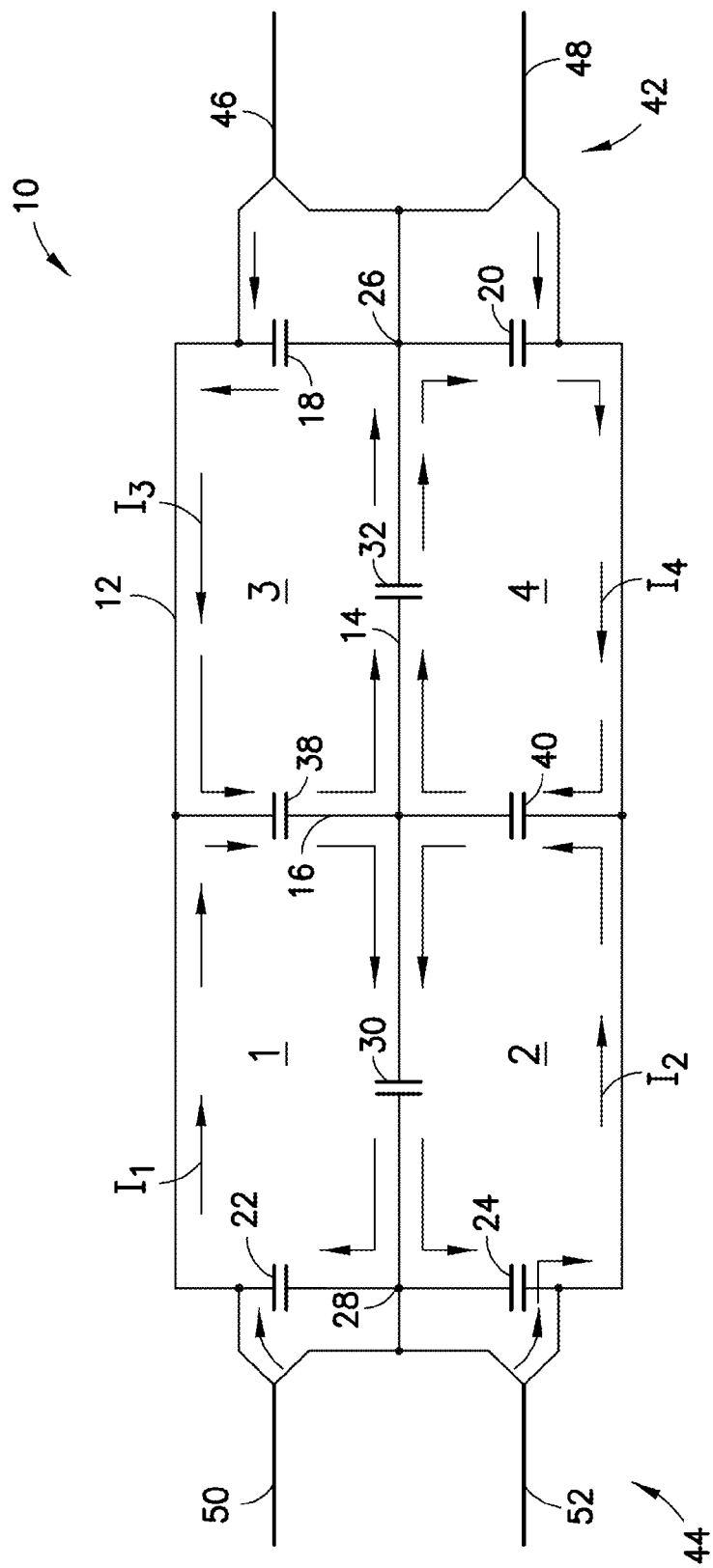
FIG. 26 is a schematic diagram of the coil of FIG. 3 illustrating the manner in which current is induced therein when in Focus ALL mode.
Figure 27:
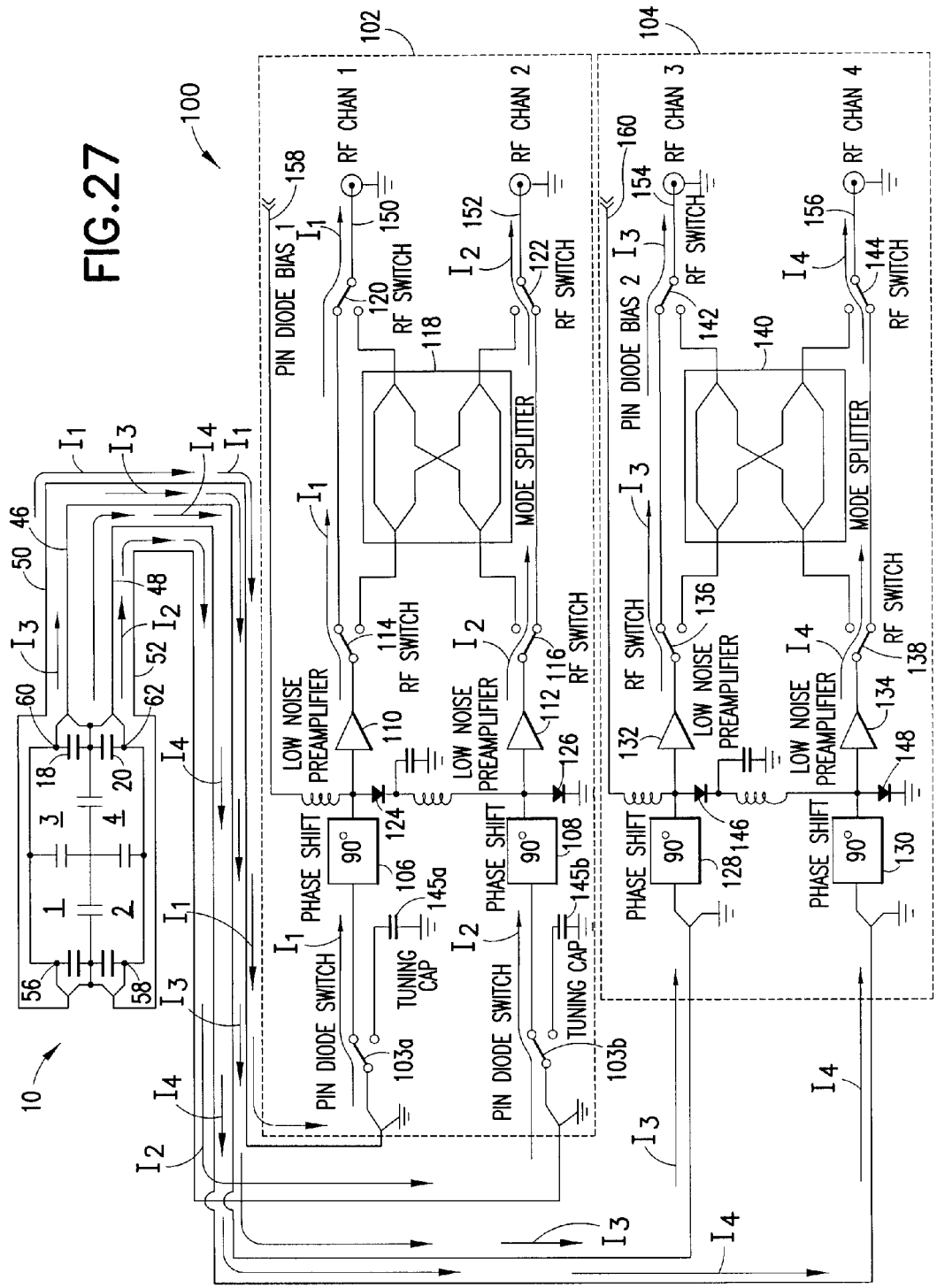
FIG. 27 is a block diagram of the interface device of FIG. 4 illustrating the manner in which the interface device operates when in Focus ALL mode.
Figure 28A:
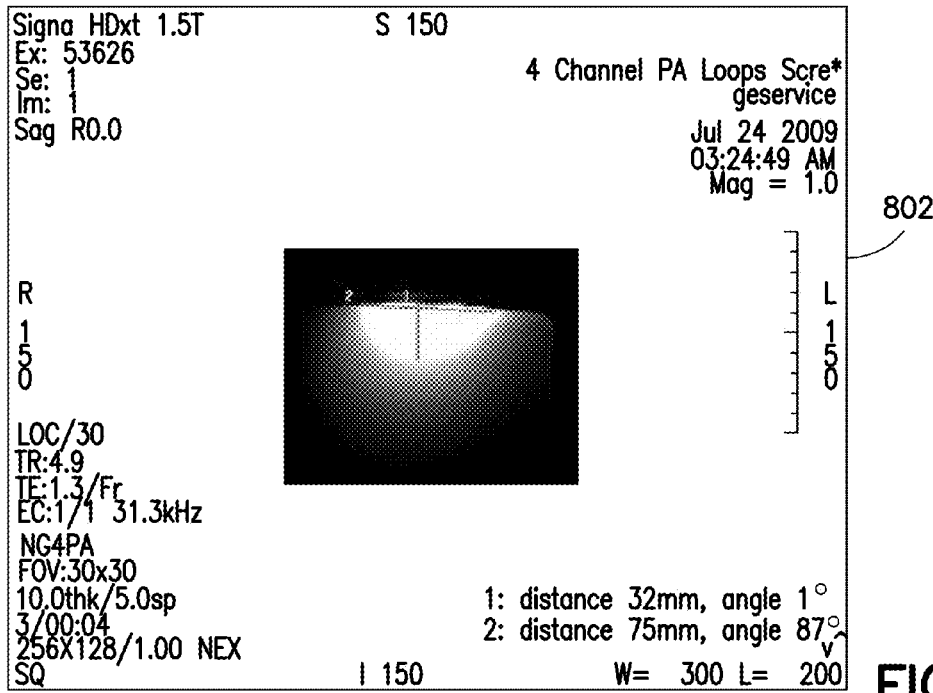
FIGS. 28A-C are exemplary images produced by an MR system when the coil of FIG. 3 and the interface device of FIG. 4 are operating in Focus ALL mode and FIG. 28D is a schematic diagram of the coil of FIG. 3 illustrating the orientation of the coil to produce the images in FIGS. 28A-C.
Figure 28B:
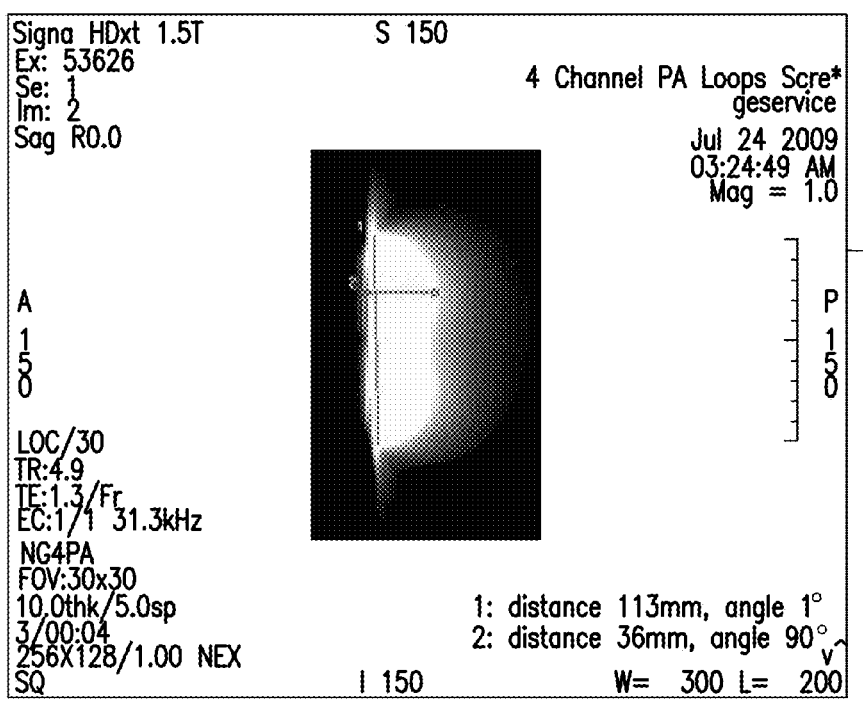
Figure 28C:
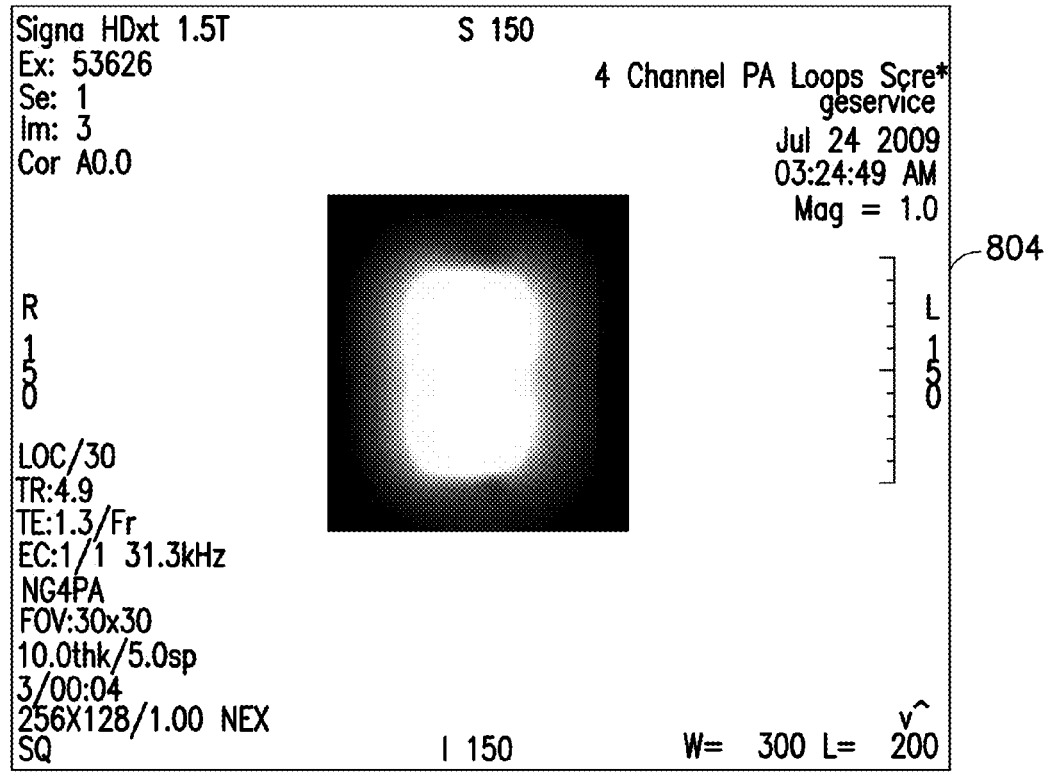
Figure 28D:
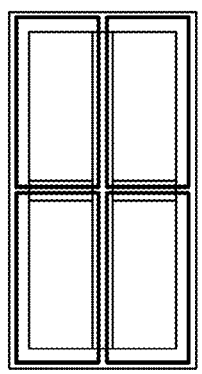

With reference to FIGS. 26-28, the operation of coil 10 and interface device 100 when in Focus ALL mode will now be described. As shown in FIG. 26, during the receive cycle, when operating in Focus ALL mode, coil 10 operates in the same manner as described hereinabove for Focus UP, Focus DOWN, Focus LEFT, and Focus RIGHT modes. This is shown by current flows as represented by arrows $I_1$, $I_2$, $I_3$, and $I_4$. However, interface device 100 functions in a different manner. Instead of utilizing the configuration files to ignore the output of the one or more of first channel 150, second channel 152, third channel 154, or fourth channel 156 as in Focus UP, Focus DOWN, Focus LEFT, or Focus RIGHT modes, none of the channels are ignored. Accordingly, a 4-channel signal is provided to the host scanner to provide image 800 (sagittal view), as shown in FIG. 28B, image 802 (axial view), as shown in FIG. 28A, and image 804 (coronal view), as shown in FIG. 28C. The flow of current through interface device 100 when in Focus ALL mode is shown by arrows $I_1$-$I_4$ in FIG. 27.

While the above-description provided some of the more useful modes of operation for this four channel common-conductor endorectal coil 10, other combinations are possible. For instance, an operator could set the interface to only receive signals from the first element 1 and fourth element 4 of coil 10 or the second element 2 and third element 3 of coil 10.

Several other modes of operation may also be available. For instance, other modes of operation include a loop-saddle configuration in both a Focus UP configuration and a Focus DOWN configuration. The Focus UP Loop Saddle configuration works with outer loop currents of elements 1 and 2 of coil 10 and a saddle output from elements 1 and 2. A similar approach is applicable for the Focus DOWN Loop Saddle configuration. One can also utilize a 2-channel output by getting a Whole Loop output of elements 1 and 2 of coil 10 as one channel and a Whole Loop output of elements 3 and 4 of coil 10 as the second channel. Similar variants can be achieved with a Whole Loop output of elements 1 and 3 as one channel output and a Whole Loop output of elements 2 and 4 as the second channel. Similar variants can be provided with the saddle configuration discussed in greater detail hereinabove as well.

The multichannel common-conductor array has been demonstrated to be excitable in multiple predetermined select configurations, in such a way that the array can be operated as a whole region plus select regions (focus/zoom) as the region of interest. The whole mode enables the need to free up only 1-channel as well as 2- or 4-channels or whatever the need may be. For instance, Whole Loop mode or Whole Saddle mode and can be used first to help in identifying the region of interest. Subsequently, the region of interest can be focused in further with a selection of one of the Focus modes.

Furthermore, with no additional parts on the coil 10, the present invention expands the scope of the coil from not only being a phased coil, but could be made to work as a single large loop or single large saddle or a combination of quadrature coils as described in greater detail hereinabove. In other words, the same coil 10, by smart current drives through the interface device 10, can be used to provide an output of 1-channel, 2-channel, or 4-channel output. This multiple channel output selection provides the freedom to integrate with other surface coils by freeing up only the needed number of channels.

For example, in an application like a torso array, if there are 16 receivers at the scanner, one can design a mesh of say 64 common conductor loops and by appropriately driving using concepts of the present invention, the operator can turn off certain legs (by mutual current cancellation) and get a large superset (whole mode) of the entire coil by 16-channel output. Also, when an operator wants to focus in the upper region, the lower section can be deactivated and internal loops can be excited to provide focused image. The same approach can be utilized for Focus LEFT, RIGHT, LOWER, etc, that gives the freedom to provide focused signal output from any desired region by this approach.

This novel concept provides for significantly expanding the scope of surface coils to use lesser number (say 16 preamplifiers only for 16 receiver outputs) of preamplifiers and save significantly in the cost of hardware and using the smart loop excitation technology described hereinabove to provide Whole/Focus outputs.

In addition, as discussed hereinabove, U.S. Patent Application Publication No. 2009/0076378 also discloses an intracavity probe having a plurality of such coil loops deployed in a phased array configuration in which each coil loop is critically overlapped by its neighbor. However, such an overlapped looped design suffers from various deficiencies when compared to coil 10 of the present invention and cannot achieve all of the modes discussed hereinabove. More specifically, the advantages of coil 10 over such an overlapped coil design are illustrated in the following table.

| Whole Focus mode Common Conductor Design | Traditional Overlapped Loop Design |
|---|---|
| Varied output at every channel through the interface device - yielding various options of imaging configurations | Constant output at every channel |
| Choice of linearly polarized - horizontal or vertical mode, circularly polarized modes. | Linearly polarized output |
| Focus ALL mode - 4 loops output | 4 individual channels - Focus ALL mode - 4 loops output |
| 2 individual channels - Focus UP, DOWN, LEFT or RIGHT loops output | 2 individual channels - Focus UP, DOWN, LEFT or RIGHT loops output |
| 2 individual channels - Focus UP, DOWN - in loop + saddle output configuration | Not possible |
| Whole Mode - One big outer loop | Not possible |
| Whole Mode - One big saddle | Not possible |
| Whole Mode - Big loop + saddle output | Not possible |

It is expected that not only will the 4-channel common-conductor endorectal coil array improve on the SNR performance of existing endorectal coils, such as the eCoil™ line of coils produced by MEDRAD, Inc., but the added capability of selectable modes may add even more value to this next generation product.

Although the invention has been described in detail for the purpose of illustration based on what is currently considered to be the most practical and preferred embodiments, it is to be understood that such detail is solely for that purpose and that the invention is not limited to the disclosed embodiments, but, on the contrary, is intended to cover modifications and equivalent arrangements. For example, it is to be understood that the present invention contemplates that, to the extent possible, one or more features of any embodiment can be combined with one or more features of any other embodiment.

The invention claimed is:

1. A coil for use with a magnetic resonance (MR) system for obtaining images or spectra of a region of interest, the coil comprising:

(a) an outer loop having a first end and a second end formed from a conductive material for detecting MR signals oriented vertical to a plane of the coil, the outer loop comprising a plurality of capacitors therein including:
  (i) a first drive capacitor and a second drive capacitor of approximately equal value serially deployed within the outer loop at the first end of the outer loop with a junction node therebetween; and
  (ii) a third drive capacitor and a fourth drive capacitor serially deployed within the outer loop at the second end of the outer loop with a junction node therebetween;
(b) a first center conductor extending between and evenly bisecting the junction nodes of the outer loop, the first center conductor having two capacitors symmetrically deployed along its length; and
(c) a second center conductor extending perpendicular to the first center conductor and evenly bisecting the outer loop, the second center conductor having two capacitors symmetrically deployed along its length,
wherein the first center conductor and the second center conductor form four subloops within the outer loop, such that output from each of the four subloops is received in an interface device connectable to the coil by a first output line connected across the first and the second drive capacitors and a second output line connected across the third and the fourth drive capacitors, and switching circuitry in the interface device is configurable to selectively ignore or detect output from at least one of the four subloops, thereby allowing a scanner coupled to the interface device to produce images in at least four different modes in a single imaging procedure.

2. The coil of claim 1, wherein
the first output line has a first pair of coaxial cables, with both shield wires of the first pair of coaxial cables connected to the junction node between the first drive capacitor and the second drive capacitor and the central signal conductors of the first pair of coaxial cables connected across the first and the second drive capacitors, respectively; and
the second output line has a second pair of coaxial cables, with both shield wires of the second pair of coaxial cables connected to the junction node between the third drive capacitor and the fourth drive capacitor and the central signal conductors of the second pair of coaxial cables connected across the third and the fourth drive capacitors, respectively.

3. The coil of claim 2, wherein each coaxial cable has a nominal impedance of 50 ohms and an electrical length of $S_L + n(\lambda/4)$ where $S_L$ is a supplemental length whose reactance is of a same magnitude as a reactance of the drive capacitor corresponding thereto, n is an odd integer, and $\lambda$ is a wavelength of the operating frequency of the MR system.

4. The coil of claim 3, wherein the first pair of coaxial cables and the second pair of coaxial cables terminate in at least one plug for connecting the coil to the interface device.

5. The coil of claim 1, wherein the at least four different modes are selected by an operator at a console of the MR system from a group consisting of: Whole Loop, Whole Saddle, Whole Loop and Whole Saddle, Focus UP, Focus DOWN, Focus LEFT, Focus RIGHT, and Focus ALL.

6. An intracavity probe for use with a magnetic resonance (MR) system for obtaining images or spectra of a region of interest within a cavity of a patient, said intracavity probe comprising a coil including:

(a) an outer loop having a first end and a second end formed from a conductive material for detecting MR signals oriented vertical to a plane of the coil, the outer loop comprising a plurality of capacitors therein including:
(i) a first drive capacitor and a second drive capacitor of approximately equal value serially deployed within the outer loop at the first end of the outer loop with a junction node therebetween; and
(ii) a third drive capacitor and a fourth drive capacitor serially deployed within the outer loop at the second end of the outer loop with a junction node therebetween;
(b) a first center conductor extending between and evenly bisecting the junction nodes of the outer loop, the first center conductor having two capacitors symmetrically deployed along its length; and
(c) a second center conductor extending perpendicular to the first center conductor and evenly bisecting the outer loop, the second center conductor having two capacitors symmetrically deployed along its length,
wherein the first center conductor and the second center conductor form four subloops within the outer loop, such that output from each of the four subloops is received in an interface device connectable to the coil by a first output line connected across the first and the second drive capacitors and a second output line connected across the third and the fourth drive capacitors, and switching circuitry in the interface device is configurable to selectively ignore or detect output from at least one of the four subloops, thereby allowing a scanner coupled to the interface device to produce images in at least four different modes in a single imaging procedure.

7. The probe of claim 6, wherein
the first output line has a first pair of coaxial cables, with both shield wires of the first pair of coaxial cables connected to the junction node between the first drive capacitor and the second drive capacitor and the central signal conductors of the first pair of coaxial cables connected across the first and the second drive capacitors, respectively; and
the second output line has a second pair of coaxial cables, with both shield wires of the second pair of coaxial cables connected to the junction node between the third drive capacitor and the fourth drive capacitor and the central signal conductors of the second pair of coaxial cables connected across the third and the fourth drive capacitors, respectively.

8. The probe of claim 7, wherein each coaxial cable has a nominal impedance of 50 ohms and an electrical length of $S_L + n(\lambda/4)$ where $S_L$ is a supplemental length whose reactance is of a same magnitude as a reactance of the drive capacitor corresponding thereto, n is an odd integer, and X is a wavelength of the operating frequency of the MR system.

9. The probe of claim 8, wherein the first pair of coaxial cables and the second pair of coaxial cables terminate in at least one plug for connecting the coil to the interface device.

10. The probe of claim 6, wherein the at least four different modes are selected by an operator at a console of the MR system from a group consisting of: Whole Loop, Whole Saddle, Whole Loop and Whole Saddle, Focus UP, Focus DOWN, Focus LEFT, Focus RIGHT, and Focus ALL.

11. A system for obtaining images or spectra of a region of interest, the system comprising:
(a) a coil comprising:
(i) an outer loop having a first end and a second end formed from a conductive material for detecting MR signals oriented vertical to a plane of the coil, the outer loop comprising a plurality of capacitors therein including:
(A) a first drive capacitor and a second drive capacitor of approximately equal value serially deployed within the outer loop at the first end of the outer loop with a junction node therebetween; and
(B) a third drive capacitor and a fourth drive capacitor serially deployed within the outer loop at the second end of the outer loop with a junction node therebetween; and
(ii) a first center conductor extending between and evenly bisecting the junction nodes of the outer loop, the first center conductor having two capacitors symmetrically deployed along its length; and
(iii) a second center conductor extending perpendicular to the first center conductor and evenly bisecting the outer loop such that the first center conductor and the second center conductor form four subloops within the outer loop, the second center conductor having two capacitors symmetrically deployed along its length; and
(b) an interface device for interfacing the coil with a magnetic resonance (MR) system, the interface device comprising:
(i) a first interface device module comprising:
(A) a first phase shifting network connectable across the third drive capacitor of the coil that enables a phase of the signals received therefrom to be shifted by a predetermined angle;
(B) a second phase shifting network connectable across the fourth drive capacitor of the coil enables a phase of the signals received therefrom to be shifted by the predetermined angle;
(C) a first switching network of the first interface device module comprising a first switching device for directing an output from the first phase shifting network and a second switching device for directing an output of the second phase shifting network;
(D) a mode splitter of the first interface device module configured to receive an input from the first switching network; and
(E) a second switching network of the first interface device module comprising a third switching device and a fourth switching device, the third switching device for receiving an output from one of the first switching device and the mode splitter and sending the output to a first receiver of the MR system, and the fourth switching device for receiving an output from one of the second switching device and the mode splitter and sending the output to a second receiver of the MR system; and
(ii) a second interface device module comprising:
(A) a third phase shifting network connectable across the first drive capacitor of the coil that enables a phase of the signals received therefrom to be shifted by the predetermined angle;
(B) a fourth phase shifting network connectable across the second drive capacitor of the coil enables a phase of the signals received therefrom to be shifted by the predetermined angle;
(C) a first switching network of the second interface device module comprising a first switching device for directing an output from the third phase shifting network and a second switching device for directing an output of the fourth phase shifting network;
(D) a mode splitter of the second interface device module configured to receive an input from the first switching network; and (E) a second switching network of the second interface device module comprising a third switching device and a fourth switching device, the third switching device for receiving an output from one of the first switching device and the mode splitter and sending the output to a third receiver of the MR system, and the fourth switching device for receiving an output from one of the second switching device and the mode splitter and sending the output to a fourth receiver of the MR system, wherein the switching networks of the first interface device module and the switching networks of the second interface device module are configured to allow the MR system to selectively ignore or detect the output from at least one of the third switching device of the first interface device module, the fourth switching device of the first interface device module, the third switching device of the second interface device module, and the fourth switching device of the second interface device module, thereby allowing the MR system connected to the interface device to produce images in a plurality of different modes.

12. The system of claim 11, wherein the first interface device module further comprises:
a first preamplifier disposed between the first phase shifting network and the first switching device of the first interface device module; and
a second preamplifier disposed between the second phase shifting network and the second switching device of the first interface device module.

13. The system of claim 11, wherein the second interface device module further comprises:
a third preamplifier disposed between the third phase shifting network and the first switching device of the second interface device module; and
a fourth preamplifier disposed between the fourth phase shifting network and the second switching device of the second interface device module.

14. The system of claim 11, further comprising:
a first output line having a first pair of coaxial cables, with both shield wires of the first pair of coaxial cables connected to the junction node between the first drive capacitor and the second drive capacitor and the central signal conductors of the first pair of coaxial cables connected across the first and the second drive capacitors, respectively; and
a second output line having a second pair of coaxial cables, with both shield wires of the second pair of coaxial cables connected to the junction node between the third drive capacitor and the fourth drive capacitor and the central signal conductors of the second pair of coaxial cables connected across the third and the fourth drive capacitors, respectively.

15. The system of claim 14, wherein each coaxial cable has a nominal impedance of 50 ohms and an electrical length of $S_L+n(\lambda/4)$ where $S_L$ is a supplemental length whose reactance is of a same magnitude as a reactance of the drive capacitor corresponding thereto, n is an odd integer, and 2 is a wavelength of the operating frequency of the MR system.

16. The system of claim 15, wherein the first pair of coaxial cables and the second pair of coaxial cables terminate in at least one plug for connecting the coil to the interface device.

17. The system of claim 11, wherein the plurality of different modes are selected by an operator at a console of the MR system from a group consisting of: Whole Loop, Whole Saddle, Whole Loop and Whole Saddle, Focus UP, Focus DOWN, Focus LEFT, Focus RIGHT, and Focus ALL.

18. The system of claim 11, wherein the predetermined angle is 90 degrees.

* * * * *

UNITED STATES PATENT AND TRADEMARK OFFICE
CERTIFICATE OF CORRECTION

PATENT NO.        : 8,610,435 B2
APPLICATION NO.   : 12/952988
DATED             : December 17, 2013
INVENTOR(S)       : Sambandamurthy et al.

Page 1 of 1

It is certified that error appears in the above-identified patent and that said Letters Patent is hereby corrected as shown below:

IN THE SPECIFICATION:

In Column 10, Line 51, delete "sigma®" and insert -- signa --, therefor.
In Column 16, Line 63, delete "scanner First" and insert -- scanner. First --, therefor.
In Column 17, Line 3, delete "scanner" and insert -- scanner. --, therefor.

IN THE CLAIMS:

In Column 25, Line 50, in Claim 8, delete "X" and inset -- λ --, therefor.
In Column 28, Line 23, in Claim 15, delete "2 is a" and insert -- λ is a --, therefor.

Signed and Sealed this
Eighth Day of April, 2014

Michelle K. Lee
*Deputy Director of the United States Patent and Trademark Office*